(12) United States Patent
Lee et al.

(10) Patent No.: US 9,142,510 B2
(45) Date of Patent: Sep. 22, 2015

(54) 3D INTERCONNECT STRUCTURE COMPRISING THROUGH-SILICON VIAS COMBINED WITH FINE PITCH BACKSIDE METAL REDISTRIBUTION LINES FABRICATED USING A DUAL DAMASCENE TYPE APPROACH

(75) Inventors: Kevin J. Lee, Beaverton, OR (US); Mark T. Bohr, Aloha, OR (US); Andrew W. Yeoh, Portland, OR (US); Christopher M. Pelto, Beaverton, OR (US); Hiten Kothari, Beaverton, OR (US); Seshu V. Sattiraju, Portland, OR (US); Hang-Shing Ma, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 110 days.

(21) Appl. No.: 13/994,666

(22) PCT Filed: Oct. 28, 2011

(86) PCT No.: PCT/US2011/058407
§ 371 (c)(1),
(2), (4) Date: Jun. 14, 2013

(87) PCT Pub. No.: WO2013/062590
PCT Pub. Date: May 2, 2013

(65) Prior Publication Data
US 2013/0285257 A1    Oct. 31, 2013

(51) Int. Cl.
*H01L 23/48*    (2006.01)
*H01L 23/52*    (2006.01)
(Continued)

(52) U.S. Cl.
CPC ...... *H01L 23/5384* (2013.01); *H01L 21/76898* (2013.01); *H01L 23/481* (2013.01);
(Continued)

(58) Field of Classification Search
USPC ............ 257/774, 737, 777, 778, 4, 448, 618, 257/678, 750, 773, 99; 438/107, 108, 106, 438/667, 15, 51, 25, 618, 652
See application file for complete search history.

(56) References Cited

U.S. PATENT DOCUMENTS 6,479,900 B1    11/2002    Shinogi et al.
6,551,856 B1    4/2003    Lee
(Continued)

FOREIGN PATENT DOCUMENTS

JP    2010-219526    9/2010

OTHER PUBLICATIONS

Rebha El Farhane et al., "A Successful Implementation of Dual Damascene Architecture to Copper TSV for 3D High Density Applications" 3D Systems Integration Conference (3DIC), 2010 IEEE International, Nov. 16-18, pp. 1-4.*
(Continued)

*Primary Examiner* — Chuong A Luu
*Assistant Examiner* — Cory Eskridge
(74) *Attorney, Agent, or Firm* — Blakely, Sokoloff, Taylor & Zafman LLP

(57) ABSTRACT

A 3D interconnect structure and method of manufacture are described in which a through-silicon vias (TSVs) and metal redistribution layers (RDLs) are formed using a dual damascene type process flow. A silicon nitride or silicon carbide passivation layer may be provided between the thinned device wafer back side and the RDLs to provide a hermetic barrier and etch stop layer during the process flow.

19 Claims, 25 Drawing Sheets

(51) Int. Cl.
*H01L 23/538* (2006.01)
*H01L 21/768* (2006.01)
*H01L 23/00* (2006.01)
*H01L 23/522* (2006.01)
*H01L 21/683* (2006.01)

(52) U.S. Cl.
CPC .............. *H01L23/522* (2013.01); *H01L 24/03* (2013.01); *H01L 24/05* (2013.01); *H01L 21/6835* (2013.01); *H01L 21/76807* (2013.01); *H01L 24/13* (2013.01); *H01L 2221/6835* (2013.01); *H01L 2224/02372* (2013.01); *H01L 2224/02375* (2013.01); *H01L 2224/0401* (2013.01); *H01L 2224/05548* (2013.01); *H01L 2224/05567* (2013.01); *H01L 2224/05611* (2013.01); *H01L 2224/05644* (2013.01); *H01L 2224/05647* (2013.01); *H01L 2224/05655* (2013.01); *H01L 2224/05657* (2013.01); *H01L 2224/05664* (2013.01); *H01L 2224/11002* (2013.01); *H01L 2224/13022* (2013.01); *H01L 2224/13024* (2013.01); *H01L 2224/13111* (2013.01); *H01L 2224/13116* (2013.01); *H01L 2224/13144* (2013.01); *H01L 2224/13147* (2013.01); *H01L 2224/14131* (2013.01); *H01L 2224/16145* (2013.01); *H01L 2224/16225* (2013.01); *H01L 2924/00014* (2013.01); *H01L 2924/13091* (2013.01); *H01L 2924/1461* (2013.01)

(56) References Cited

U.S. PATENT DOCUMENTS

| | | |
|---|---|---|
| 2010/0225002 A1 | 9/2010 | Law et al. |
| 2011/0068466 A1 | 3/2011 | Chen et al. |
| 2011/0204505 A1* | 8/2011 | Pagaila et al. ................. 257/686 |

OTHER PUBLICATIONS

Rebha El Farhane, Myrian Assous, Patrick Leduc, Aurelie Thuaire, David Bouchu, Helene Feldis, Nicolas Sillon. "A successful Implementation of Dual Damascene Architecture to Copper TSV for 3D High Density Applications" pp. 1-4 (232-235 of printed book). Published 2010. IEEE (2010 IEEE International 3D Systems Integration Conference). Munich, Germany.

PCT International Search Report and Written Opinion for International Application No. PCT/US2011/058407, mailed Jul. 16, 2012, 9 pages.

Rebha El Farhane et al., :A Successful Implementation of Dual Damascene Architecture to Copper TSV for 3D High Density Applications 3D Systems Integration Conference (3DIC), 2010 IEEE International, Nov. 16-18, pp. 1-4.

Notice of Preliminary Rejection (Non-Final) from the Korean Intellectual Property Office (KIPO) dated Jun. 8, 2015 and English Translation thereof.

* cited by examiner

3D INTERCONNECT STRUCTURE COMPRISING THROUGH-SILICON VIAS COMBINED WITH FINE PITCH BACKSIDE METAL REDISTRIBUTION LINES FABRICATED USING A DUAL DAMASCENE TYPE APPROACH

CROSS-REFERENCE TO RELATED APPLICATION

This patent application is a U.S. National Phase application under 35 U.S.C. §371 of International Application No. PCT/US2011/058407, filed Oct. 28, 2011, entitled 3D INTERCONNECT STRUCTURE COMPRISING THROUGH-SILICON VIAS COMBINED WITH FINE PITCH BACKSIDE METAL REDISTRIBUTION LINES FABRICATED USING A DUAL DAMASCENE TYPE APPROACH.

BACKGROUND OF THE INVENTION

1. Field of the Invention

The present invention relates to three dimensional (3D) packaging, and more particularly to the integration of through-silicon vias (TSVs) into 3D packages.

2. Discussion of Related Art 3D packaging is emerging as a solution for microelectronics development toward system on chip (SOC) and system in package (SIP). In particular, 3D flip chip structures with TSVs have the potential for being widely adopted. TSV 3D packages generally contain two or more chips stacked vertically, with vias through silicon substrates replacing edge wiring to create an electrical connection between the circuit elements on each chip.

The Joint Electron Devices Engineering Council (JEDEC) is currently developing a WideIO standard defining the chip-to-chip landing pad interface for a logic-to-memory interface. Conventionally, the physical locations of TSVs are located directly beneath the landing pad locations on a chip, which takes up a lot of real estate. This means that all other circuitry is laid out around the TSV locations.

During TSV processing, the array of TSVs are formed through a thinned device wafer. Conventional TSV structures use either silicon dioxide or polymers as an insulator material on the backside of the thinned device wafer. These materials are not hermetic, and do not provide a robust passivation layer on the backside of the thinned device wafer.

DETAILED DESCRIPTION OF THE PRESENT INVENTION

Figure 1:
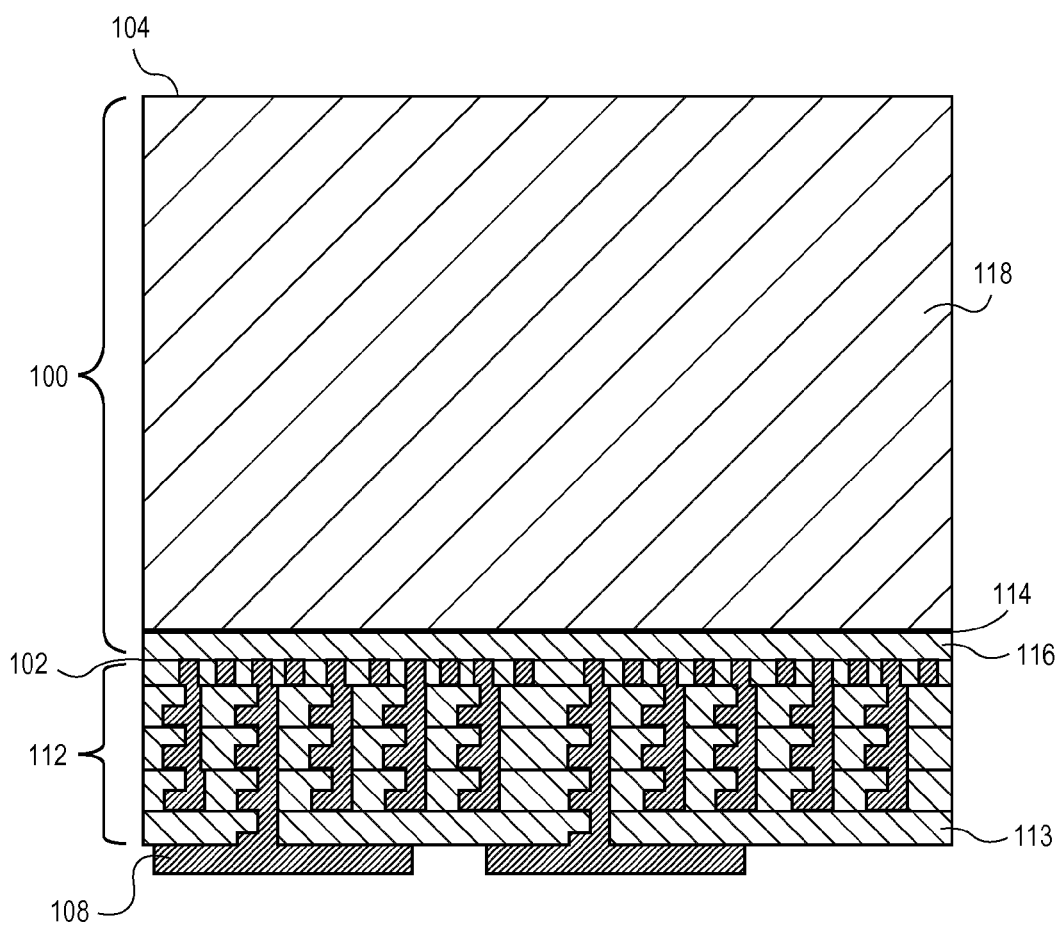
FIGS. 1-21 are a cross-sectional side view illustrations of method of manufacturing a 3D interconnect structure using dual damascene processing in accordance with embodiments of the invention.

In various embodiments, a 3D interconnect structure and method of manufacturing a 3D interconnect structure utilizing dual damascene processing is described. However, certain embodiments may be practiced without one or more of these specific details, or in combination with other known methods and materials. In the following description, numerous specific details are set forth, such as specific materials and processes, etc. in order to provide a thorough understanding of the present invention. In other instances, well-known packaging processes and manufacturing techniques have not been described in particular detail in order to not unnecessarily obscure the present invention. Reference throughout this specification to "an embodiment" or "one embodiment" means that a particular feature, structure, material, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, materials, or characteristics may be combined in any suitable manner in one or more embodiments.

The terms "over", "to", "between" and "on" as used herein may refer to a relative position of one layer with respect to other layers. One layer "over" another layer or bonded "to" another layer may be directly in contact with the other layer or may have one or more intervening layers. One layer "between" layers may be directly in contact with the layers or may have one or more intervening layers. In contrast, a first layer "on" a second layer is in contact with that second layer.

In one aspect, embodiments of the invention describe a 3D interconnect structure and process which combines through-silicon vias (TSVs) with very fine pitch backside metal redistribution layers (RDLs) using a dual damascene type process flow. This particular combination may allow for the physical locations of the TSVs to be decoupled from the chip-to-chip landing pad locations, thus providing greater circuit layout flexibility. In this manner multiple RDLs can be run between adjacent landing pad rows or columns For example, multiple RDLs may run between adjacent landing pad rows or columns separated by a pitch of 10 μm-500 μm. In accordance with embodiments of the invention, dual damascene type processing may allow for a hermetically sealed 3D interconnect structure and a finer pitch RDL architecture than can be accomplished with a plate through resist method, and allow the use of copper metal which is not possible with subtractive etching processes for producing aluminum RDL lines.

In another aspect, embodiments of the invention describe a silicon nitride or silicon carbide passivation layer which separates the backside RDLs from the bulk semiconductor (e.g. silicon) of the thinned device wafer. The silicon nitride or silicon carbide passivation layer may provide a hermetic barrier that protects the backside of the thinned device wafer from trace metal and moisture contamination during dual damascene processing. In addition, the backside passivation layer material is useful in the dual damascene process in that the passivation layer material can also act as an etch stop layer during oxide trench etching for the backside RDLs, which allows the oxide trench etching to incorporate a large amount of over-etch without causing a significant amount of the passivation layer to also be removed during dual damascene processing.

Accordingly, embodiments of the present invention describe a manner of integrating dual damascene processing into TSV processing in which the dual damascene processing may allow for the formation of very fine pitch backside RDLs and greater circuit layout flexibility, while also integrating a hermetic barrier passivation layer into the processing sequence which may provide enhanced reliability performance of the device. It is to be understood that while embodiments are described with reference to TSV processing of a silicon device wafer, the embodiments are also applicable to substrates other than silicon wafers, such as compound III-V wafers or II-VI wafers.

Figure 21:
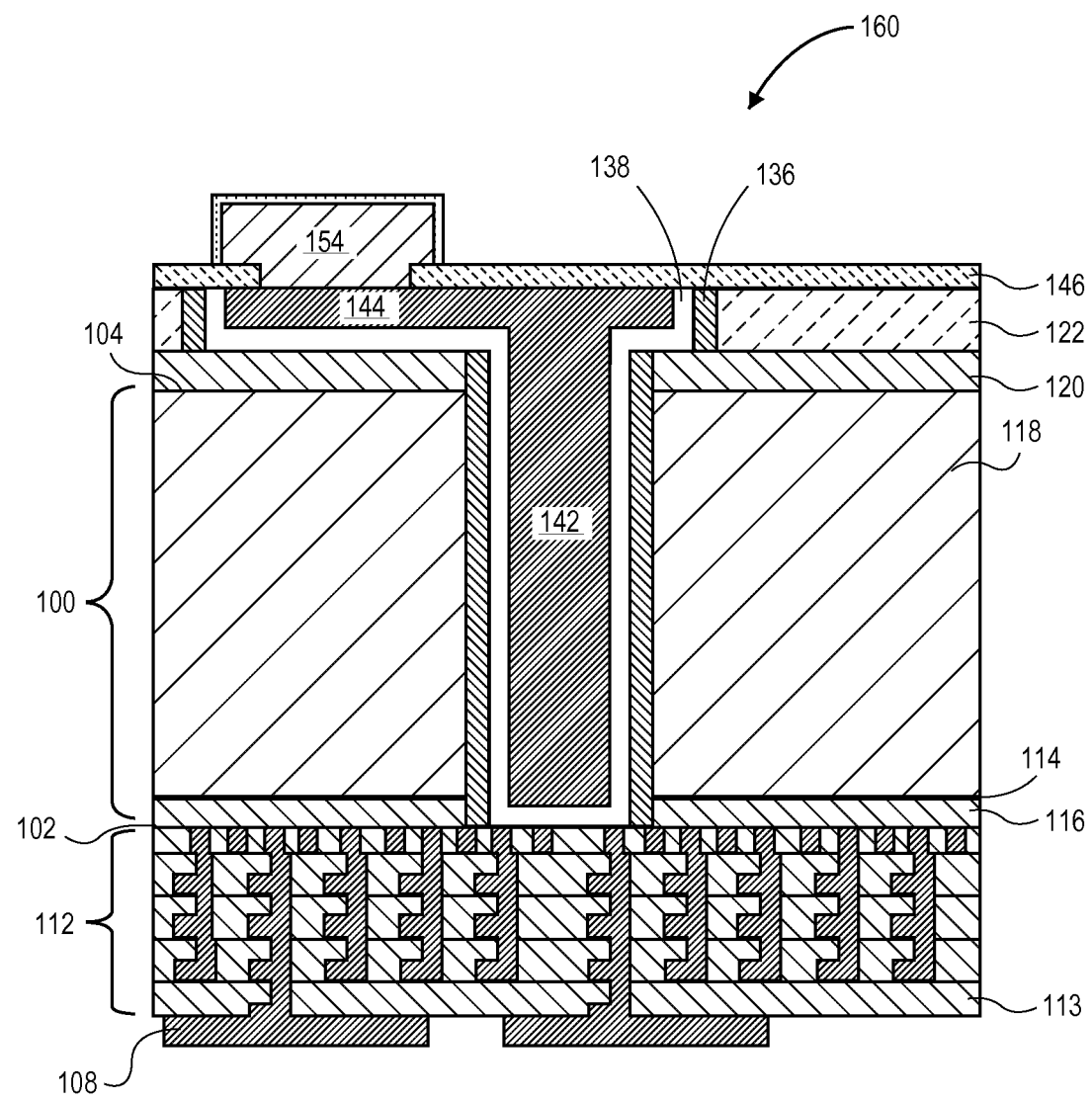

Referring to FIG. 21, in an embodiment a 3D interconnect structure 160 includes a semiconductor substrate 100 having a front surface 102 and a back surface 104, and a dual damascene via 142 and redistribution layer (RDL) 144. The via (e.g. TSV) 142 extends through the semiconductor substrate 100 between the front 102 and back 104 surfaces, and the RDL 144 is formed over the back surface 104. A passivation layer 120 may be disposed between the back surface 104 and the RDL 144 to prevent moisture and trace metal contaminants from entering the semiconductor substrate 100. Suitable passivation layer materials may be silicon carbide and silicon nitride. In some embodiments, the semiconductor substrate 100 may be a TSV processed device wafer including a plurality of the described 3D interconnect structures. Alternatively, the TSV processed device wafer is singulated to form a plurality of the semiconductor substrates which may or may not be further processed to form a plurality of chips, which may then be integrated into 3D packaging structures. Thus, in an embodiment the 3D interconnect structure 160 is a chip.

Figure 22:
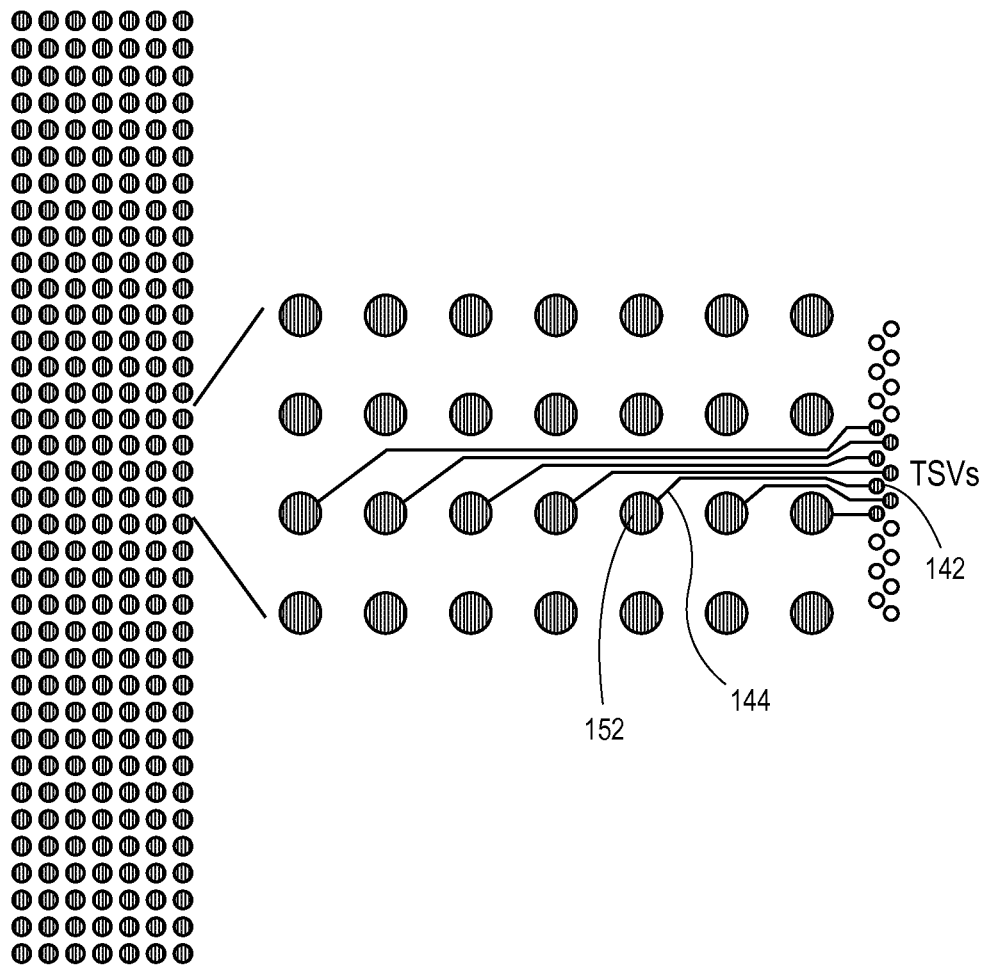
FIG. 22 is a schematic top view illustration of a 3D interconnect structure in accordance with embodiments of the invention.

Referring to FIGS. 21-22, in an embodiment the 3D interconnect structure 160 includes an array of landing pads 152 arranged over the back surface 104 in a series of rows and columns For example, the rows and columns in the array may have a pitch of 10 µm to 500 µm. An array of TSVs 142 may be arranged under the back surface 104 such that the array of TSVs 142 is not arranged in a pattern identical to the array of landing pads 152. In an embodiment, the array of TSVs 142 is not directly underneath the array of landing pads 152. In such an embodiment, a plurality of RDLs 144 may run between two of the rows of the landing pads 152 connecting one of the two rows to a corresponding number of TSVs 142 in the array of TSVs. For example, the two rows of the landing pads may be separated by a pitch of 10 µm to 500 µm. In this manner, RDLs 144 allow for flexibility in the physical locations of the TSVs 142 and circuit layout.

Figure 23:
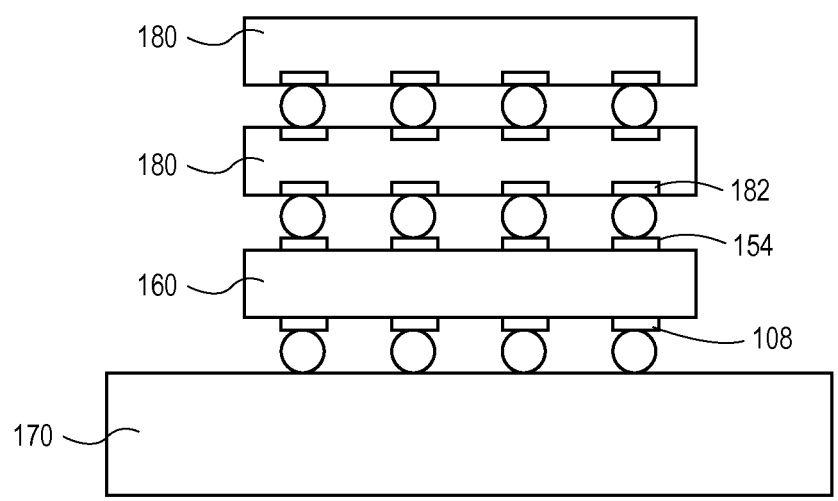
FIG. 23 is a side view illustration of a 3D package implementing TSVs in accordance with embodiments of the invention.

Referring to FIG. 23, in an embodiment a 3D package includes a base substrate 170 such as a printed circuit board or laminated substrate. A chip stack is formed over the base substrate in which the chip stack includes a chip 160 formed with the 3D interconnect structure. In an embodiment, the chip 160 is a logic chip, and one or more memory chips 180 are stacked onto the logic chip 160 with the array of landing pads of the logic chip (underneath an array of conductive bumps 154) coupled with a corresponding array of landing pads 182 of the memory chip 180, though embodiments are not limited to such and may include a variety of chip-to-chip configurations.

In an embodiment, a method of forming a 3D interconnect structure including a dual damascene via and RDL is described which includes forming a silicon carbide or silicon nitride containing passivation layer over a back surface of a device wafer, and then forming a dielectric layer over the passivation layer. A trench opening is then formed in the dielectric layer where a RDL with landing pad are desired. A via opening (e.g. TSV opening) is formed in the device wafer between the back surface and a front surface of the device wafer. A bulk volume of the via and trench may then be filled with a conductive metal such as copper by electroplating, for example. Subsequently, a conductive bump is formed over the filled trench, where the filled via is not directly beneath the landing pad. In an embodiment, forming the trench opening may be performed with plasma etching the dielectric layer using a patterned photoresist layer as a mask, and stopping the plasma etching on the passivation layer. In this manner, the passivation layer not only can function to prevent moisture and trace metal contaminants from entering the device wafer, but also function as an etch stop layer allowing for the plasma etching process to incorporate a large amount of over-etch without causing a significant amount of the passivation layer to also be removed.

Referring now to FIGS. 1-22 a method of manufacturing a 3D interconnect structure is described with reference to the figures. An inverted device wafer 100 is illustrated in FIG. 1 which may include a front surface 102 and a back surface 104. The device wafer 100 may have a variety of formations. For example, the device wafer may be a bulk semiconductor, include an epitaxial layer overlying a bulk semiconductor, or include a semiconductor-on-insulator (SOI) structure, though other structures may be used. In the particular embodiment illustrated, the device wafer 100 includes a (SOI) structure including semiconductor layer 116 overlying insulator layer 114, and bulk substrate 118. The device wafer 100 may additionally include doped regions or other doped features to form various microelectronic devices such as metal-insulator-semiconductor field effect transistors (MOSFETs), capacitors, inductors, resistors, diodes, micro-electro-mechanical systems (MEMS), other suitable active or passive devices, and combinations thereof.

A metallization structure 112 may be formed over the front surface 102 of the device wafer 100. As illustrated, metallization structure 112 includes multiple interconnect layers formed of conductive metals such as copper, aluminum, etc. and interlayer dielectric materials such as silicon oxide, carbon doped oxide, silicon nitride, etc. A passivation layer 113 may be formed over an upper portion of the metallization structure 112 to provide physical and chemical protection. One or more conductive pads 108 (e.g. copper, aluminum, etc.) may be provided over the openings in the passivation layer 113.

Figure 2:
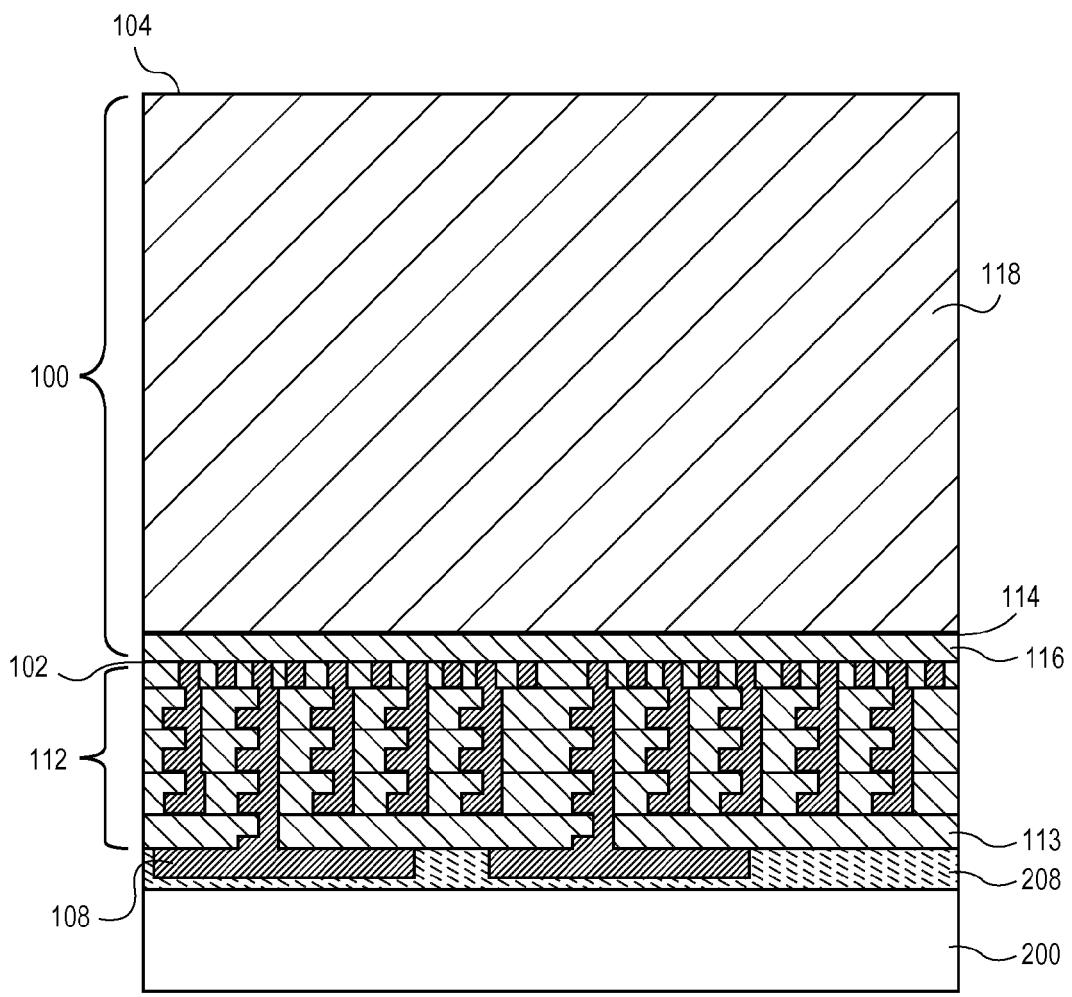
Figure 3:
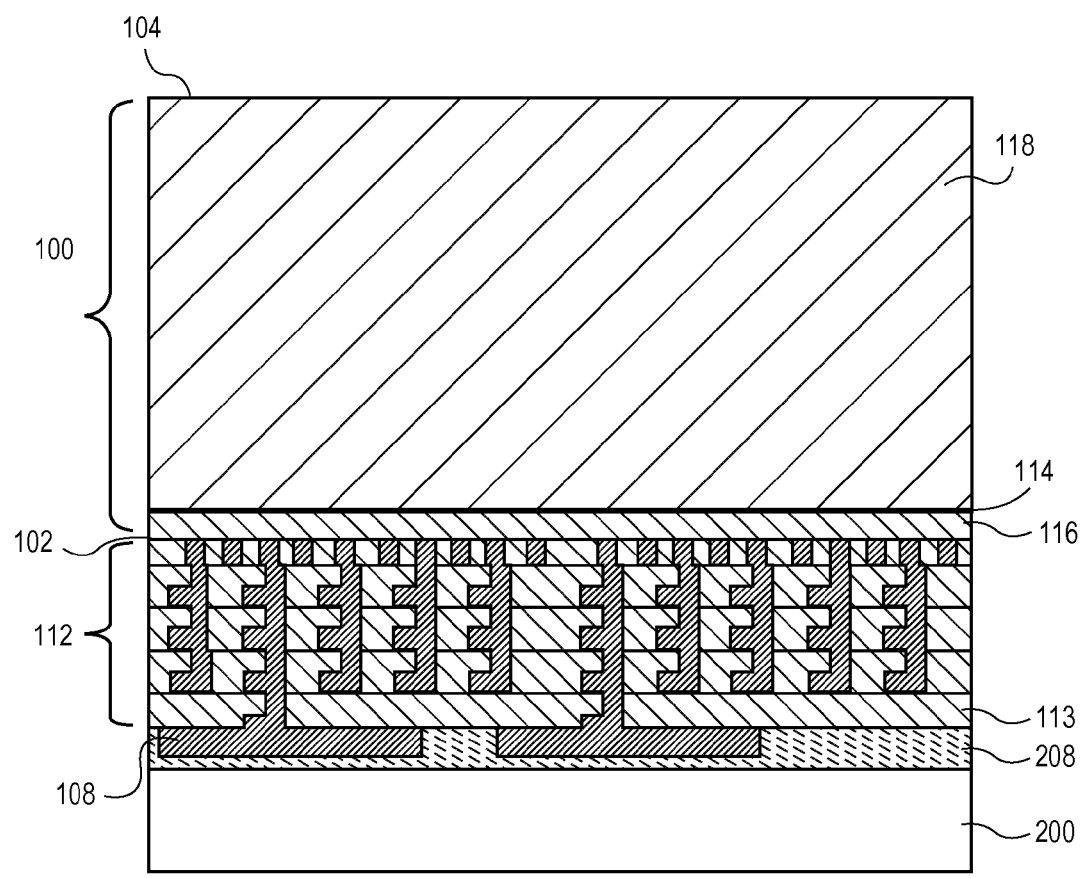
Figure 4:
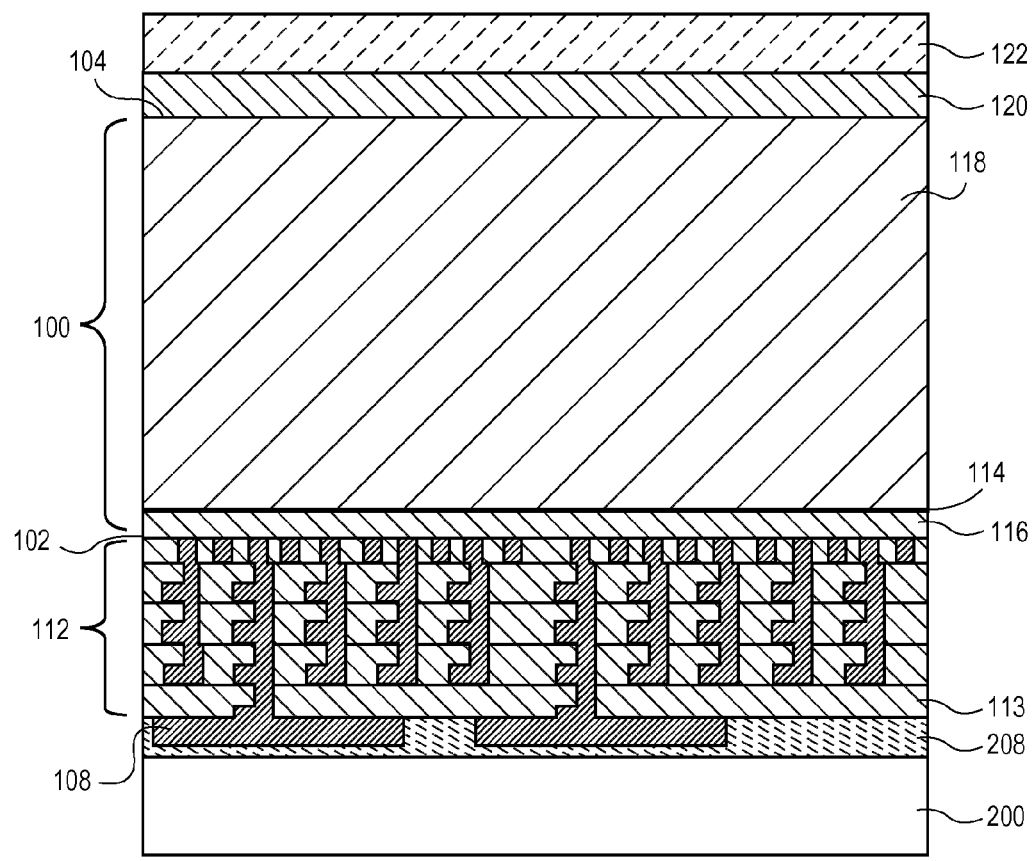

Referring now to FIGS. 2-4, the device wafer 100 is bonded to a temporary carrier wafer 200 using a commercially available temporary bonding adhesive 208 and equipment. The device wafer 100 may then be thinned back by grinding, chemical mechanical polishing (CMP), plasma etching and/or wet etching the back surface 104. For example, the device wafer 100 may be thinned back to approximately 50-100 µm in an embodiment.

After thinning the device wafer 100 a passivation layer 120 may be formed over the back surface 104 to provide a hermetic barrier, followed by a dielectric layer 122 such as silicon dioxide for the very fine pitch metal RDL. In an embodiment, suitable materials for the passivation layer 120 include silicon carbide and silicon nitride since these materials may provide a hermetic barrier that protects the back side 104 of the thinned device wafer 100 from trace metal and moisture contamination. Passivation layer 120 and dielectric layer 122 may be deposited by suitable methods such as chemical vapor deposition (CVD).

Figure 5:
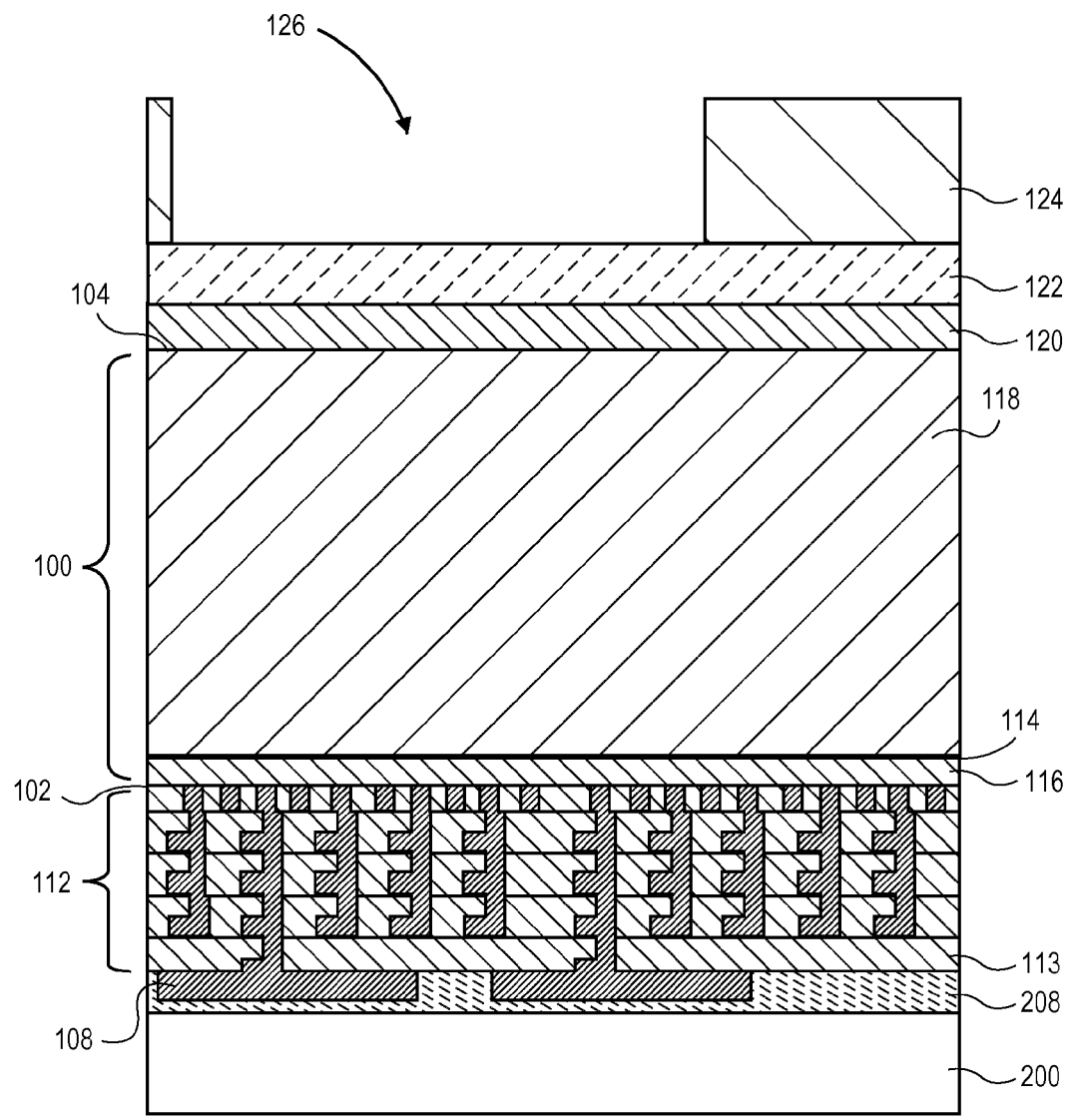
Figure 6:
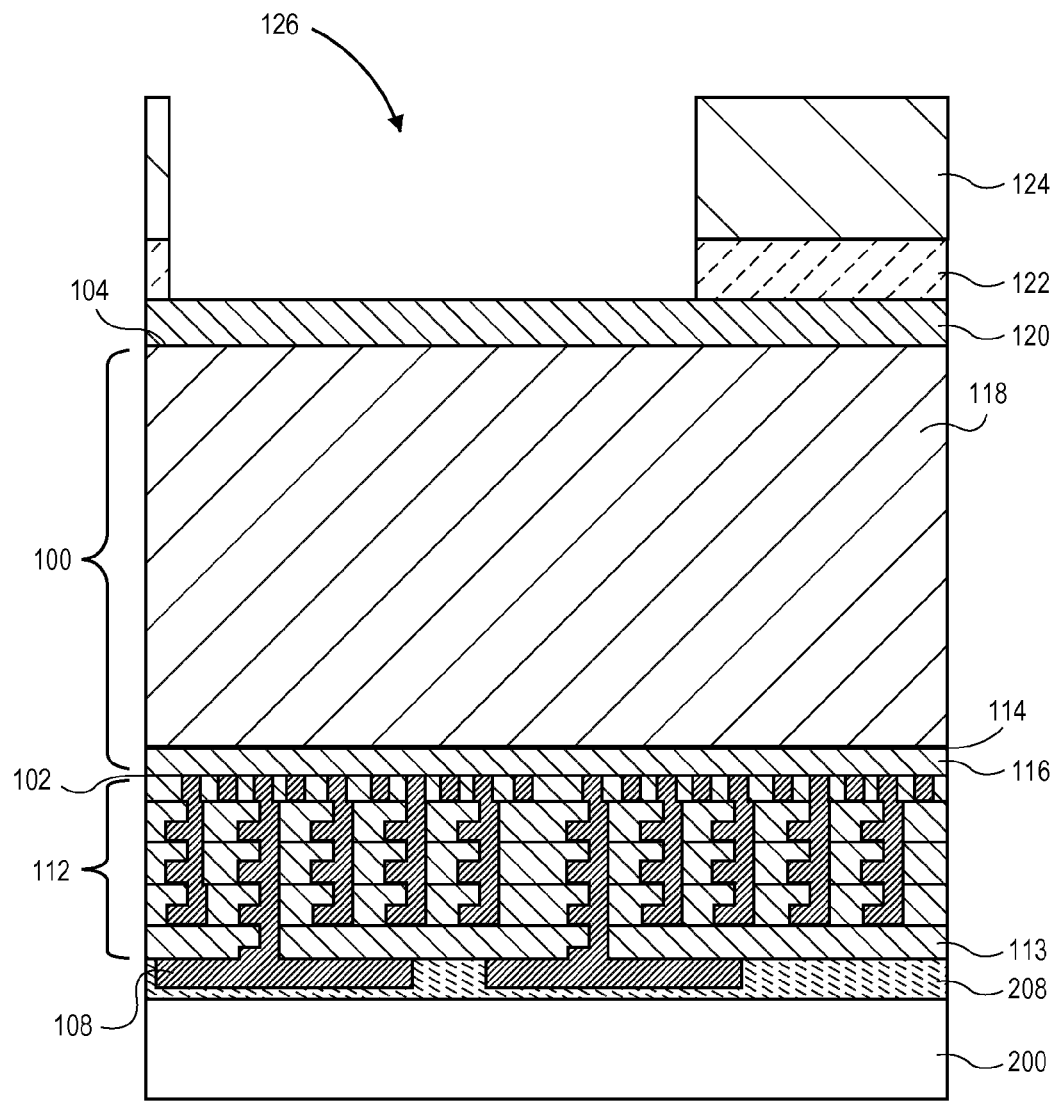
Figure 7:
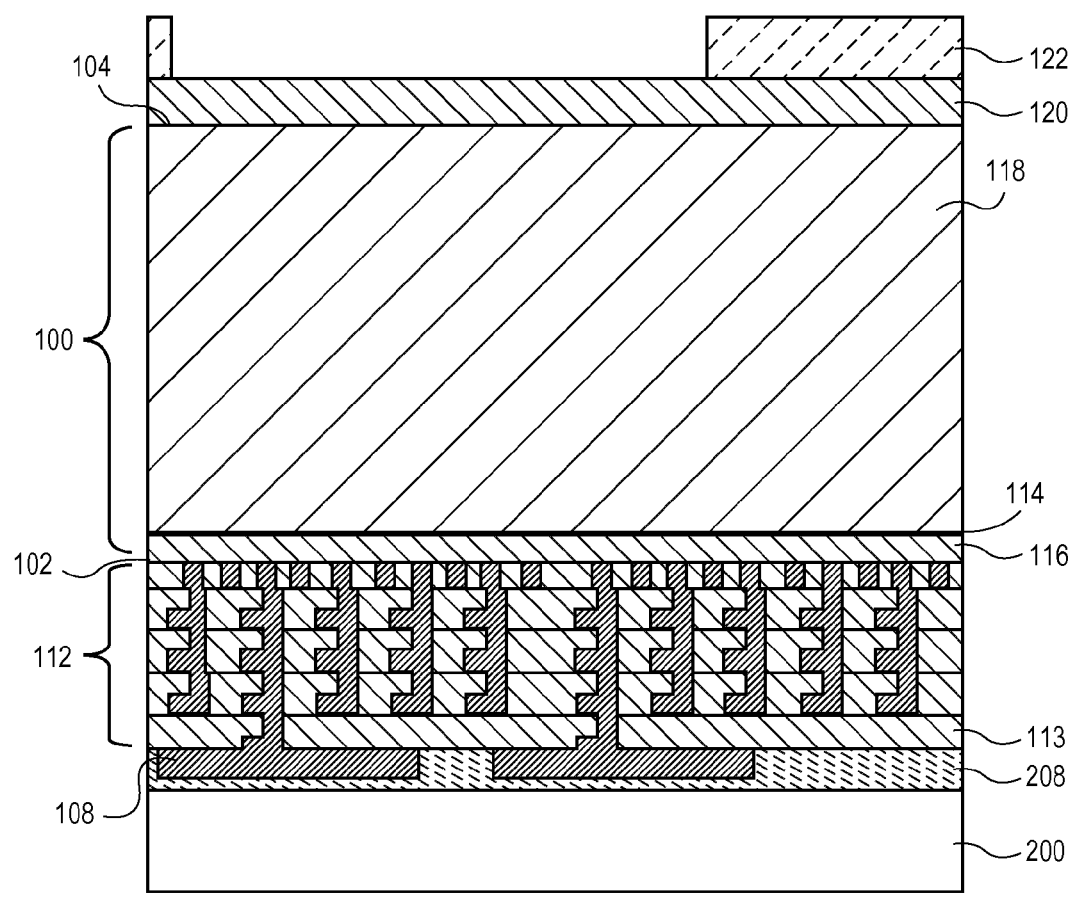

Referring now to FIGS. 5-7, a photoresist layer is coated onto the thinned device wafer, exposed and developed. After develop there are openings 126 in the patterned photoresist layer 124 at those locations where fine pitch metal RDLs including landing pads are desired. Trenches are then etched, using a suitable method such as plasma etching, through the entire depth of the dielectric layer 122 using the patterned photoresist layer 124 as a mask, stopping on passivation layer 120. In accordance with some embodiments of the dual damascene process flow, silicon carbide or silicon nitride passivation layer 120 material may act as an etch stop layer during the trench etch process to form the RDLs, allowing the trench etch process to incorporate a large amount of over-etch without causing a significant amount of passivation layer 120 to also be removed. Following the etch process, the patterned photoresist layer 124 is removed and any remaining etch polymer or residues may be cleaned off.

Figure 8:
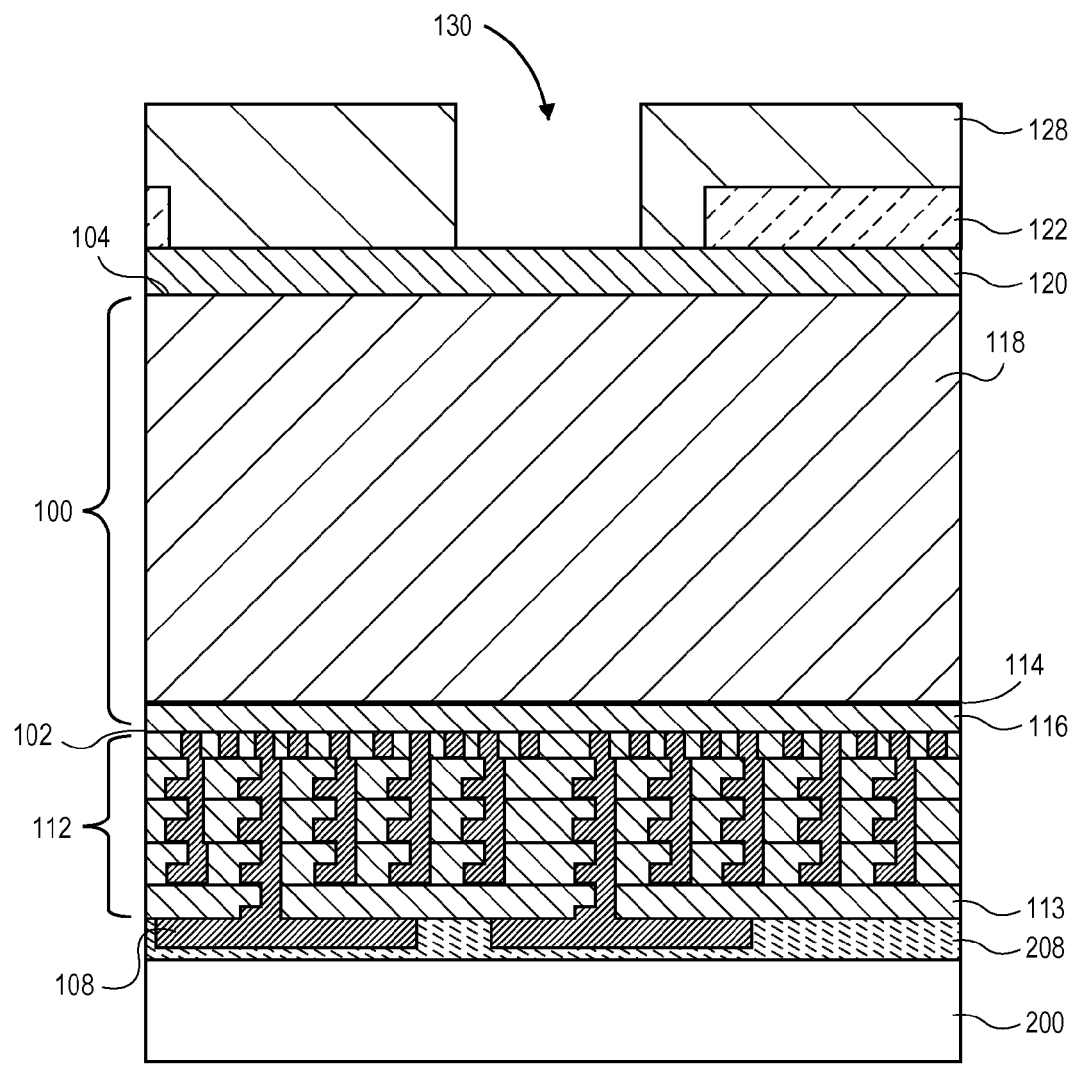
Figure 9:
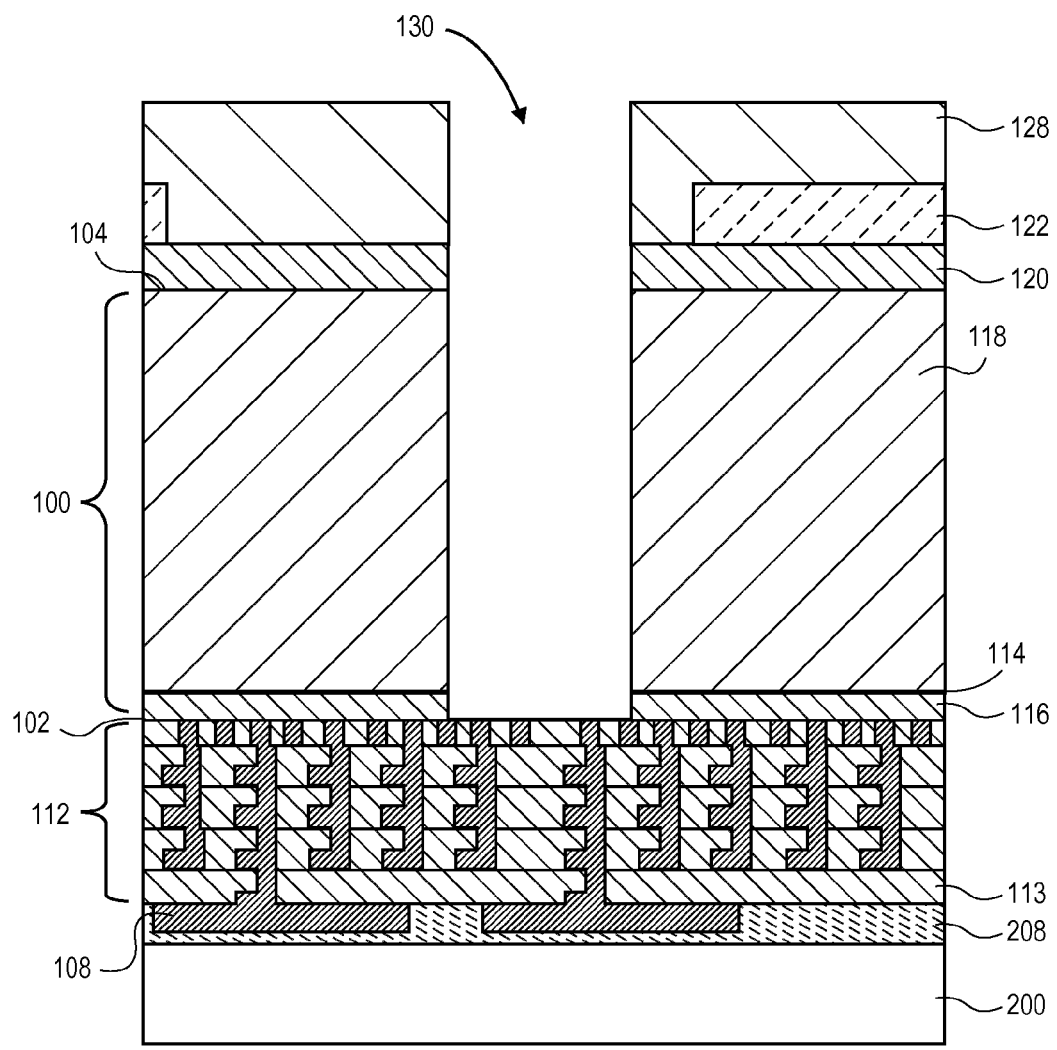
Figure 10:
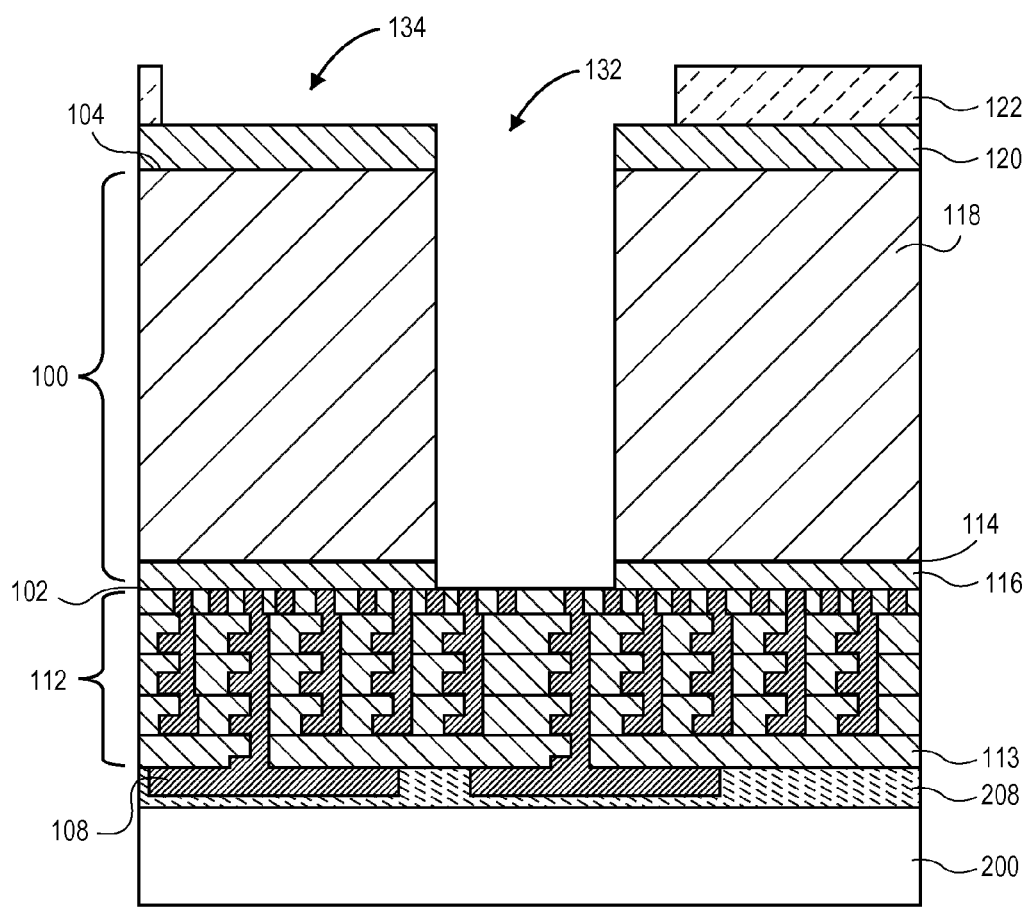

A second photoresist layer is then coated onto the thinned device wafer, exposed and developed. As illustrated in FIG. 8 there are openings 130 in the patterned photoresist layer 128 at those locations where vias (e.g. TSVs) are desired. Referring to FIGS. 9-10, via openings are then plasma etched through the passivation layer 120, and through the device wafer 100 between the back surface 104 and front surface 102, stopping on copper landing pads within the metallization structure 112. The patterned photoresist layer 128 is then removed and any remaining etch polymers or residues may be cleaned off resulting in via opening 132 (e.g. TSV opening) and trench opening 134 (e.g. RDL opening).

Figure 11:
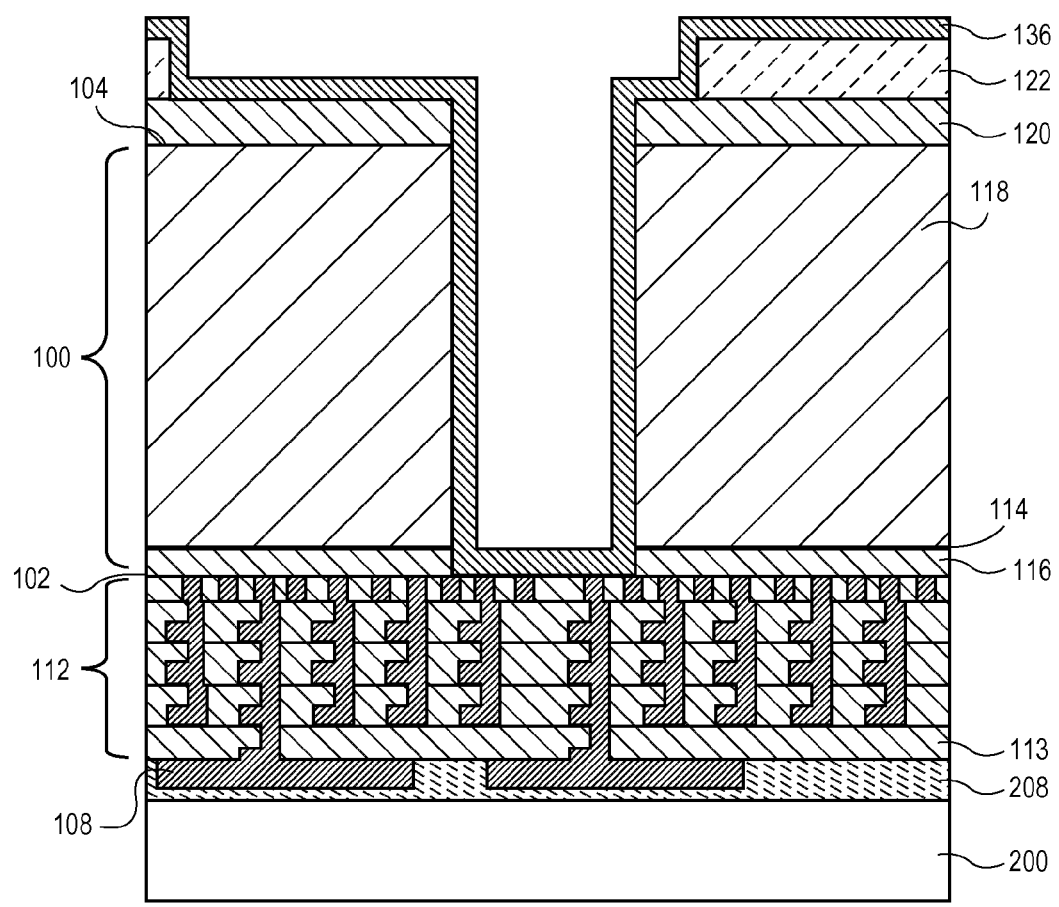
Figure 12:
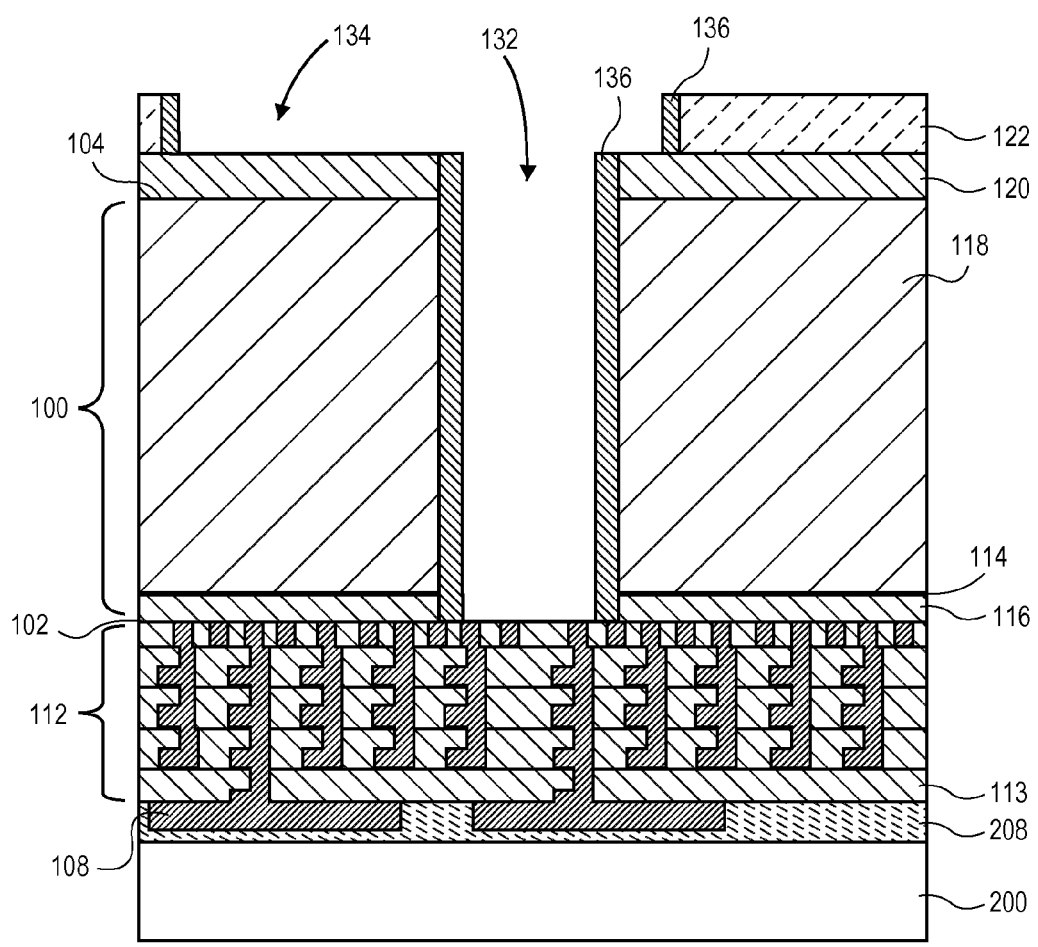

An insulating liner layer 136 is then deposited, lining the bottoms and sidewalls of the via openings 132 and trench openings 134, as well as the regions between via openings over dielectric layer 122 as illustrated in FIG. 11. Suitable materials for insulating liner layer 136 include, but are not limited to, silicon dioxide, silicon nitride, silicon carbide, and various polymers. These materials may be deposited by CVD, atomic layer deposition (ALD), and spin coating methods, for example. As illustrated in FIG. 12, an anisotropic plasma etch process may then be used to remove the insulating liner layer 136 from the bottom surfaces of the via opening 132 and trench openings 134, as well as from the regions between via openings over dielectric layer 122, while retaining a substantial thickness of the insulating liner layer 136 on the side surfaces of the via openings 132. In such an embodiment, the insulating liner layer 136 may be formed directly on the via opening 132 sidewalls defined by the bulk silicon substrate 118. Thus, the insulating liner layer 136 functions in the final 3D interconnect structure to insulate the TSV from the surrounding silicon substrate material. A substantial thickness of the insulating liner layer 136 may also remain on the side surfaces of trench openings 134.

Figure 13:
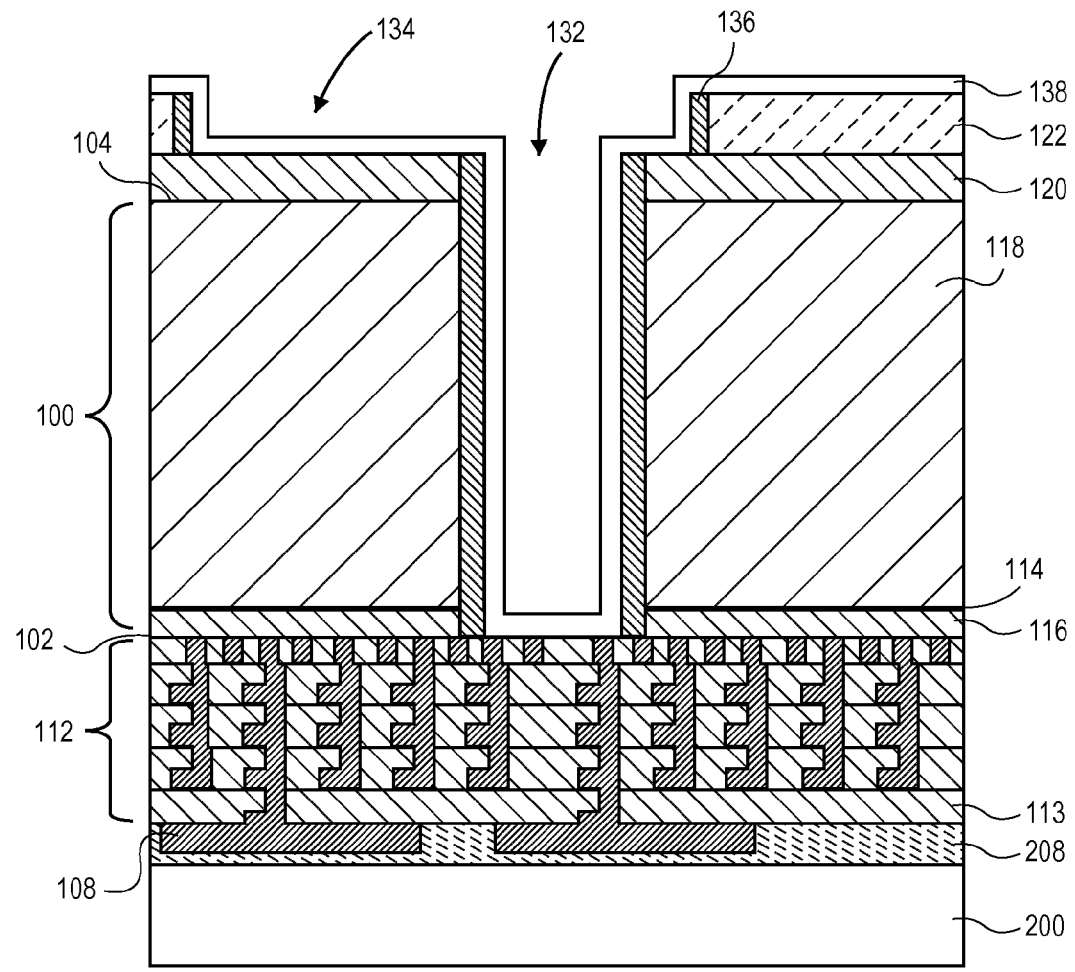
Figure 14:
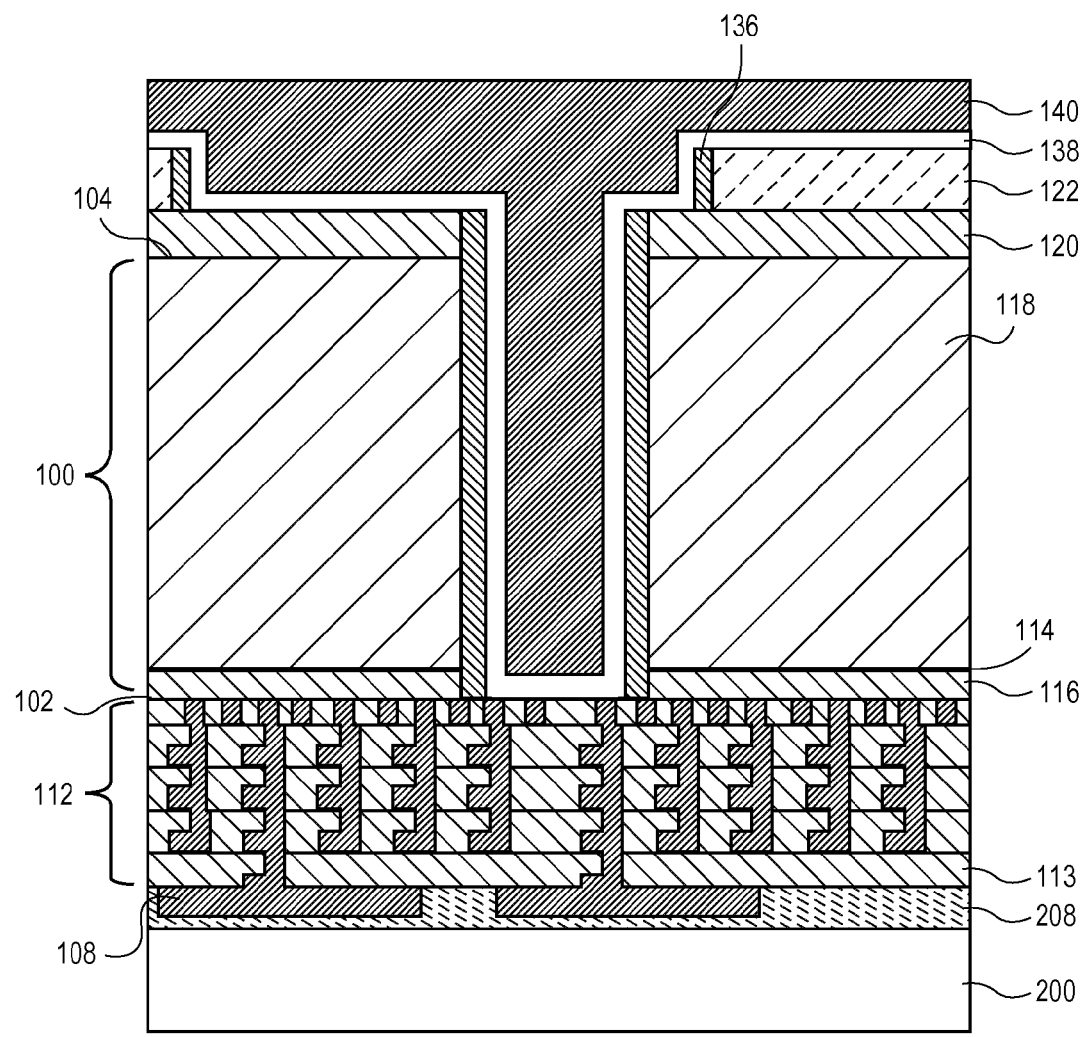
Figure 15:
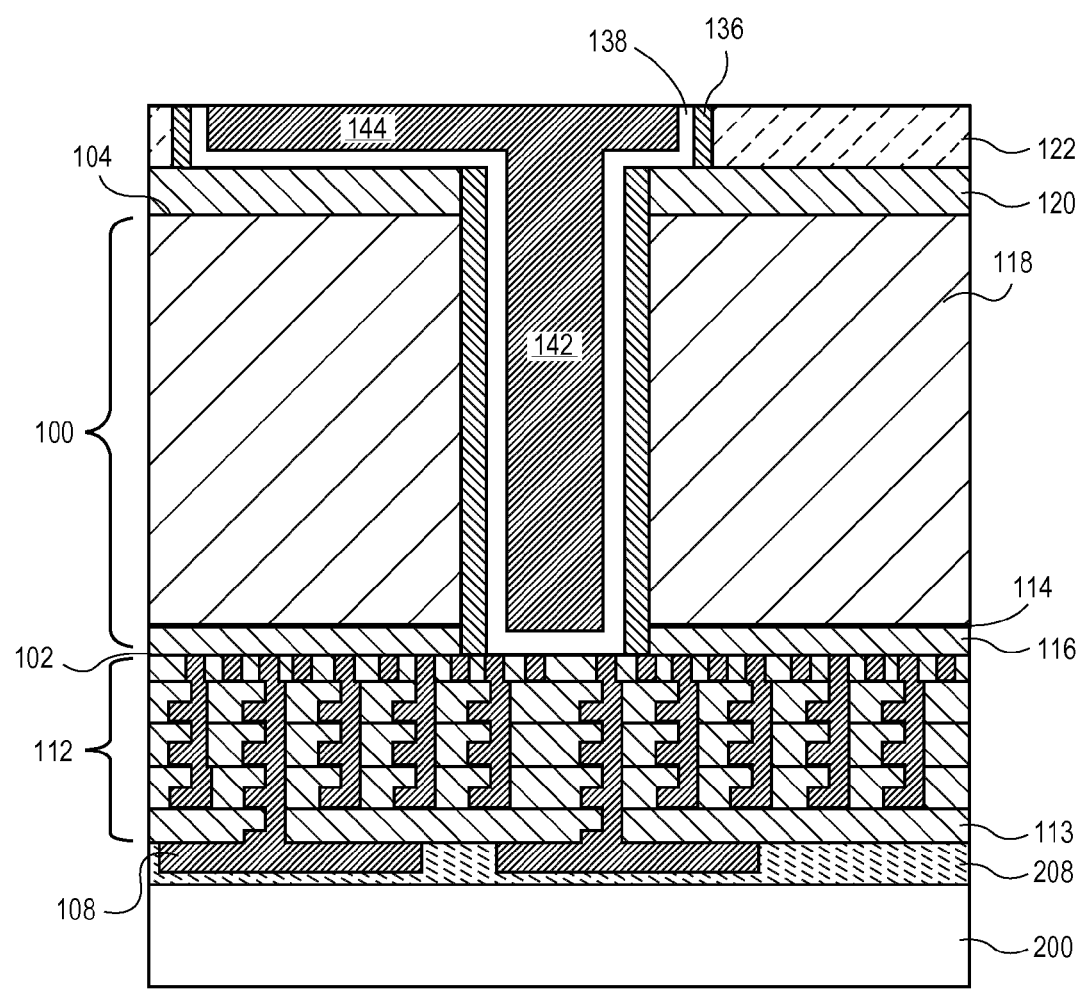
Figure 16:
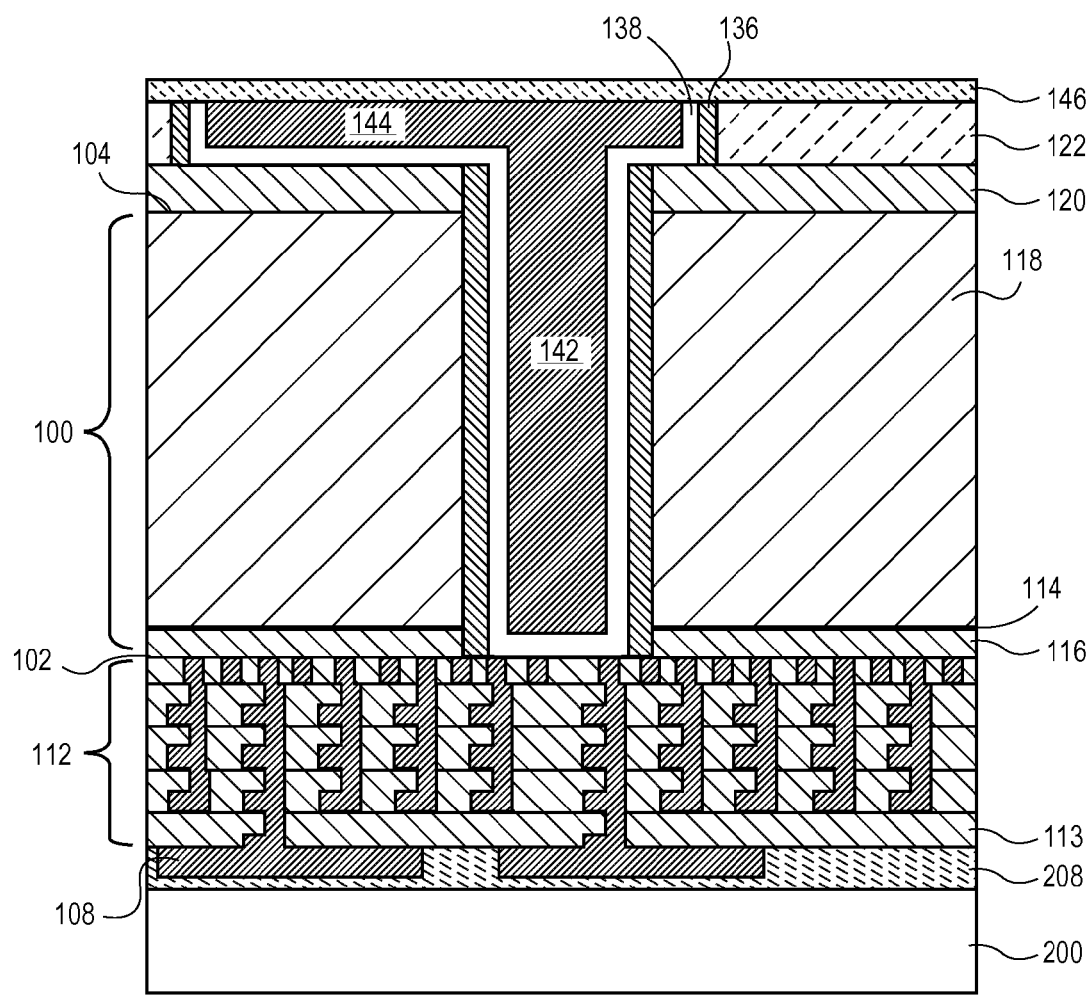
Figure 17:
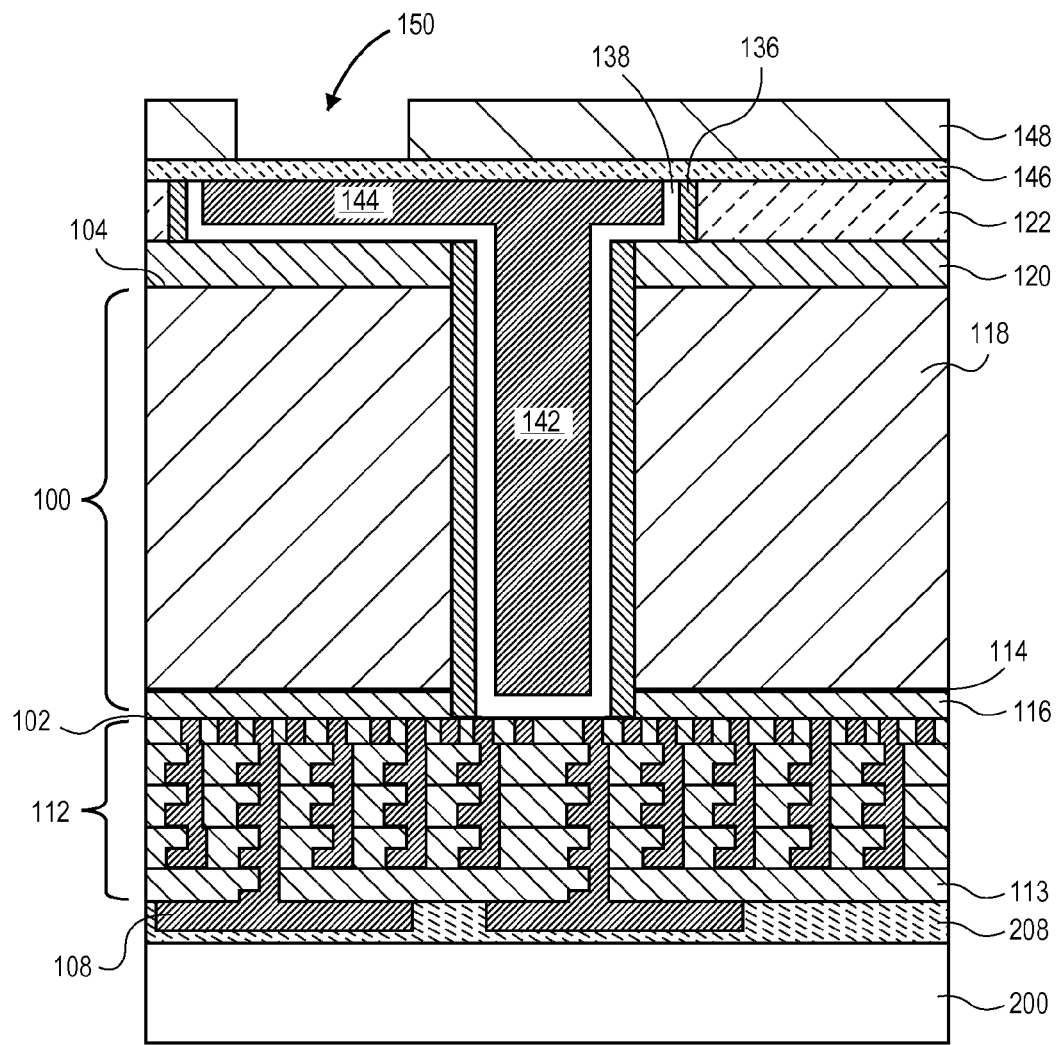
Figure 18:
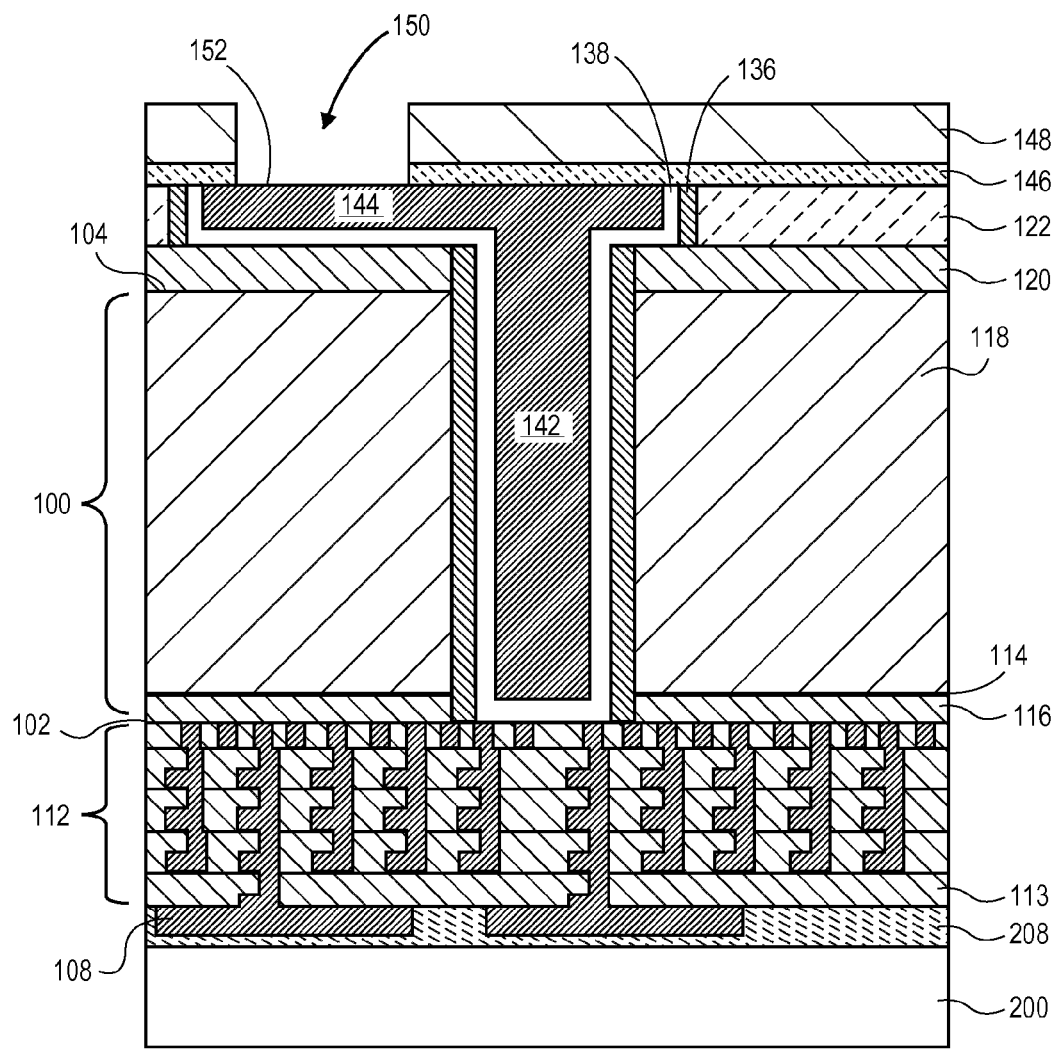
Figure 19:
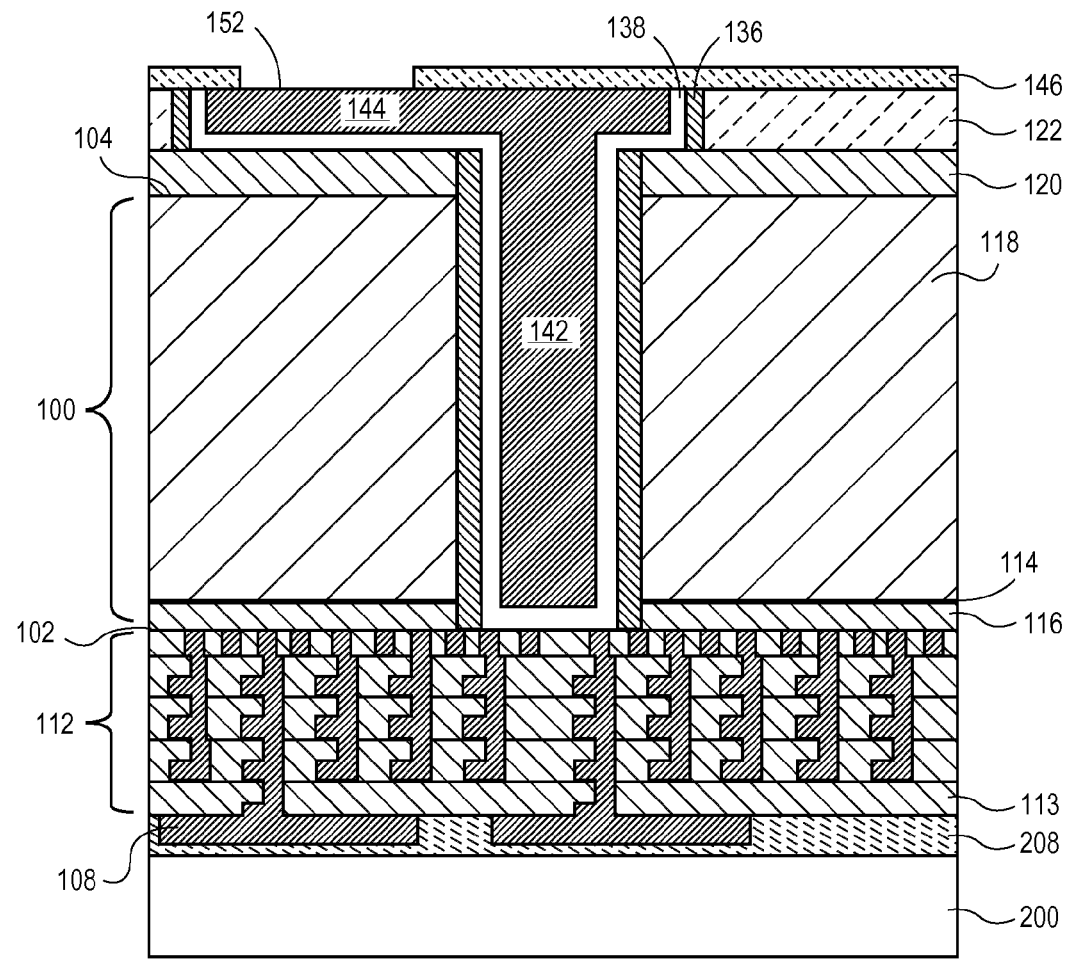

Referring to FIGS. 13-15, a barrier layer 138 and seed layer may then be deposited onto the device wafer surface. For example, the barrier layer 138 may include tantalum, titanium, or cobalt. The seed layer may be copper, for example. A blanket layer of copper 140 is then electroplated onto the device wafer surface, completely filling the TSV openings 132 and RDL openings 134 with copper. The copper overburden and the barrier layer are then removed from over dielectric layer 122 by CMP, as illustrated in FIG. 15. The resultant structure includes a dual damascene TSVs 142 and RDLs 144 in which the TSVs 142 extend through the device wafer 100 between the front 102 and back 104 surfaces and the RDLs 144 are formed over the back surface 104. In such a dual damascene configuration a single metal fill 140 occupies the bulk volume of the TSVs 142 and RDLs 144, which may be lined with barrier layer 138 and seed layer (e.g. for electroplating) and the insulating liner layer 136.

Referring now to FIGS. 16-19 landing pad openings are formed above the RDLs 144. A passivation layer 146 is deposited over of the planarized surface. Suitable materials include, but are not limited to, silicon nitride which may provide a hermetic barrier that protects against trace metal and moisture contamination, as well as protect the RDLs 144 from oxidation. A photoresist material is then coated over the passivation layer 146, exposed and developed to form a patterned photoresist layer 148. After develop there are openings 150 in the photoresist layer 148 at those locations where the RDLs 144 are to terminate at landing pads to which chip-to-chip connections are desired. Openings are then etched through the passivation layer 146 using a suitable technique such as plasma etching using the patterned photoresist layer 148 as a mask, stopping on the underlying RDL 144 landing pads 152. The photoresist layer 148 is then removed and any remaining etch polymer or residues may be cleaned off.

Figure 20:
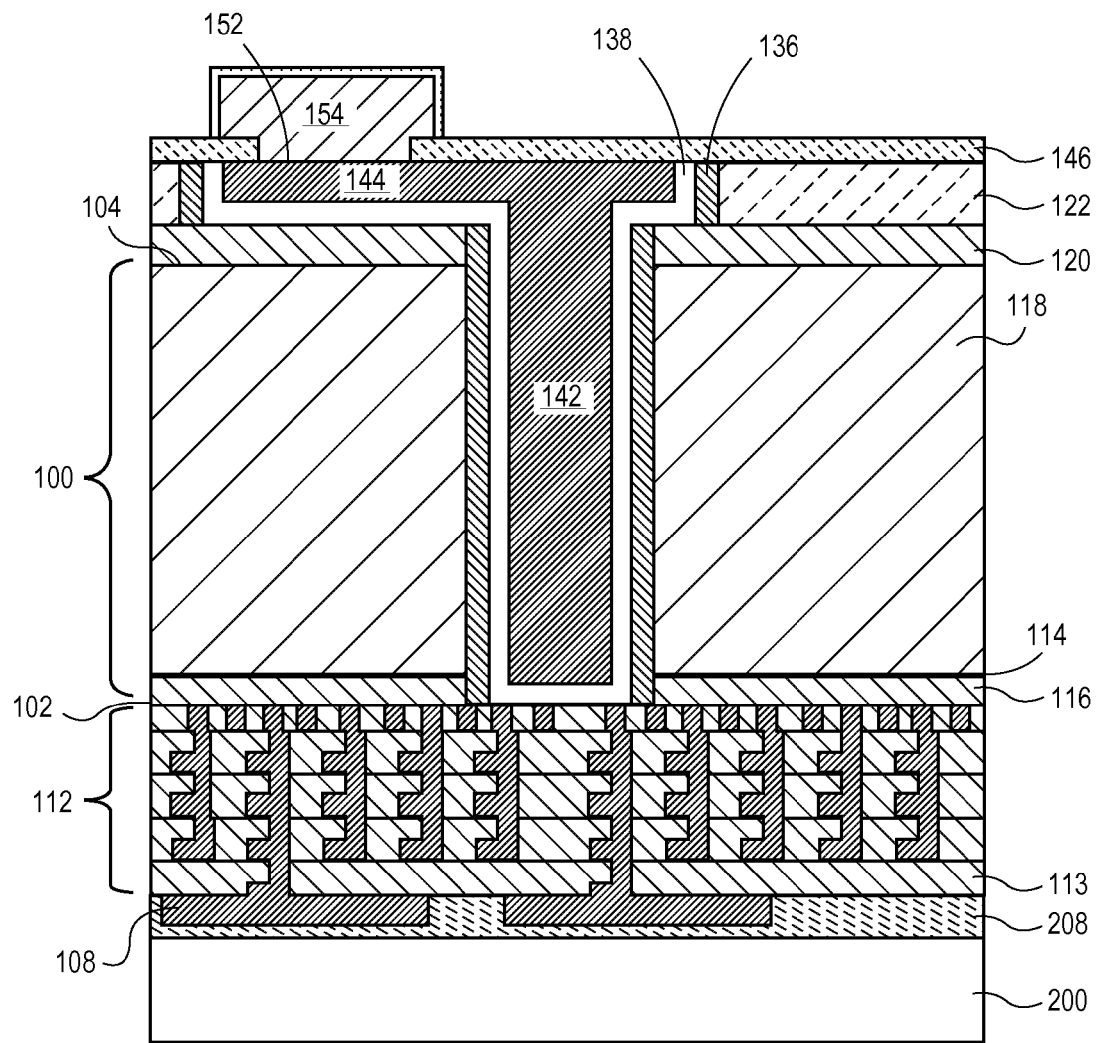

Referring now to FIG. 20 a conductive bump 154 is formed over each of the exposed RDL 144 landing pads 152. Any suitable technique may be implemented to form conductive bump 154 such as, but not limited to, solder bumping, electroplating using a patterning process, and electroless plating. In the particular embodiment illustrated in FIG. 20, the exposed RDL 144 landing pads 152 are coated with a solder-compatible surface finish. Exemplary surface finishes for conductive bumps 154 include electroless CoP/immersion Au, electroless CoWP/immersion Au, electroless NiP/immersion Au, electroless NiP/electroless Pd/immersion Au, electroless Sn, electroless NiP/electroless Sn, electroless CoP/electroless Sn, electroless CoWP/electroless Sn, electroless Cu/electroless CoP/immersion Au, electroless Cu/electroless CoWP/immersion Au, electroless Cu/electroless NiP/immersion Au, electroless Cu/electroless NiP/electroless Pd/immersion Au, electroless Cu/electroless Sn, electroless Cu/electroless NiP/electroless Sn, electroless Cu/electroless CoP/immersion Au, electroless Cu/electroless CoWP/electroless Sn. Other surface finishes may also be suitable depending upon the chip-to-chip solder material(s) and/or chip-to-chip attachment methods that are employed. In another embodiment, the conductive bump 154 may be a C4 or flip-chip bump formed of a material such as PbSn, Sn, SnAg, Cu, In, SnAgCu, SnCu, Au, etc.

The carrier wafer 200 and adhesive 208 may then removed from the device wafer 100 utilizing commercially available wafer de-bonding equipment and processing as illustrated in FIG. 21. Upon removal of the carrier wafer 200 and adhesive 208, the resulting plurality of 3D interconnect structures 160 illustrated in FIG. 21 may be singulated, and then may or may not be further processed to form chips, which may then be integrated into 3D packaging structures.

Referring to FIG. 22, an exemplary standardized chip-to-chip landing pad interface is illustrated for connecting a second chip to the 3D interconnect structure in accordance with embodiments of the present invention. As illustrated in more detail in the enlarged view, an array of landing pads 152 is arranged over the back surface 104 (see FIG. 21) in a series of rows and columns An array of TSVs 142 is arranged under the back surface 104 such that the array of TSVs is not directly underneath the array of landing pads 152. A plurality of RDLs 144 runs between two of the rows of the landing pads 152 connects one of the two rows of landing pads 152 to a corresponding number of TSVs 142 in the array of TSVs. In this manner, TSVs connecting the backside landing pads 152 to frontside circuitry (metallization structure 112) can be located anywhere on the chip. While embodiments of the invention have been described in which the array of TSVs are not directly underneath the array of landing pads and/or conductive bumps, it is to be appreciated that some of the TSVs may be directly underneath the array of landing pads and/or conductive bumps. Embodiments of the present invention provide a flexibility for the location of the TSVs by the integration of dual damascene processing. As a result, it is not required that the location of the array of TSVs be directly underneath the corresponding array of landing pads and/or conductive bumps to which the TSVs are connected.

In order to further illustrate the ability of embodiments of the present invention to allow for circuitry design flexibility, in one example, the array of landing pads 152 illustrated in FIG. 22 may have a vertical pitch of 50 μm and a horizontal pitch of 40 μm, and the landing pads 152 have a diameter of 20 μm. This leaves 30 μm to run the six RDLs 144 between two rows of landing pads 152 in the particular example. Assuming that the six RDL line widths and the seven spaces adjacent and between the RDLs 144 are the same, each RDL 144 may have a line width of 2.3 μm. Dual damascene type processing in accordance with embodiments of the invention may be particularly suitable for accomplishing such exemplary fine pitch RDL architecture, though embodiments are not so limited and may also be used for any pitch of RDL architecture.

FIG. 23 is an illustrative example of a 3D package implementing certain aspects of a 3D interconnect structure in accordance with embodiments of the invention. As illustrated a plurality of chips are stacked over a substrate 170 such as a printed circuit board or laminated substrate. For example, a chip stack may include a chip 160 including a 3D interconnect structure as described herein and one or more chips 180 stacked over chip 160. In one embodiment, chip 160 is a logic chip including a 3D interconnect structure as described herein and chips 180 are memory chips. A 3D package may alternatively include a logic chip 160 stacked over at least one memory chip 180. As illustrated, the array of conductive bumps 154, and consequently the landing pads 152 (not illustrated) underlying the conductive bumps 154 are aligned with the corresponding array of landing pads 182 of the memory chips 180, and conductive pads 108 are connected with the substrate 170. It is to be appreciated that while FIG. 23 is illustrative of exemplary stacking of logic chips 160 and memory chips 180, that embodiments of the invention are not limited to such and that a variety of chip-to-chip configurations are envisions with suitable chips such as a memory (e.g. DRAM, eFLASH, eRAM, etc), interposer, RF, MEMS, etc.

Figure 24:
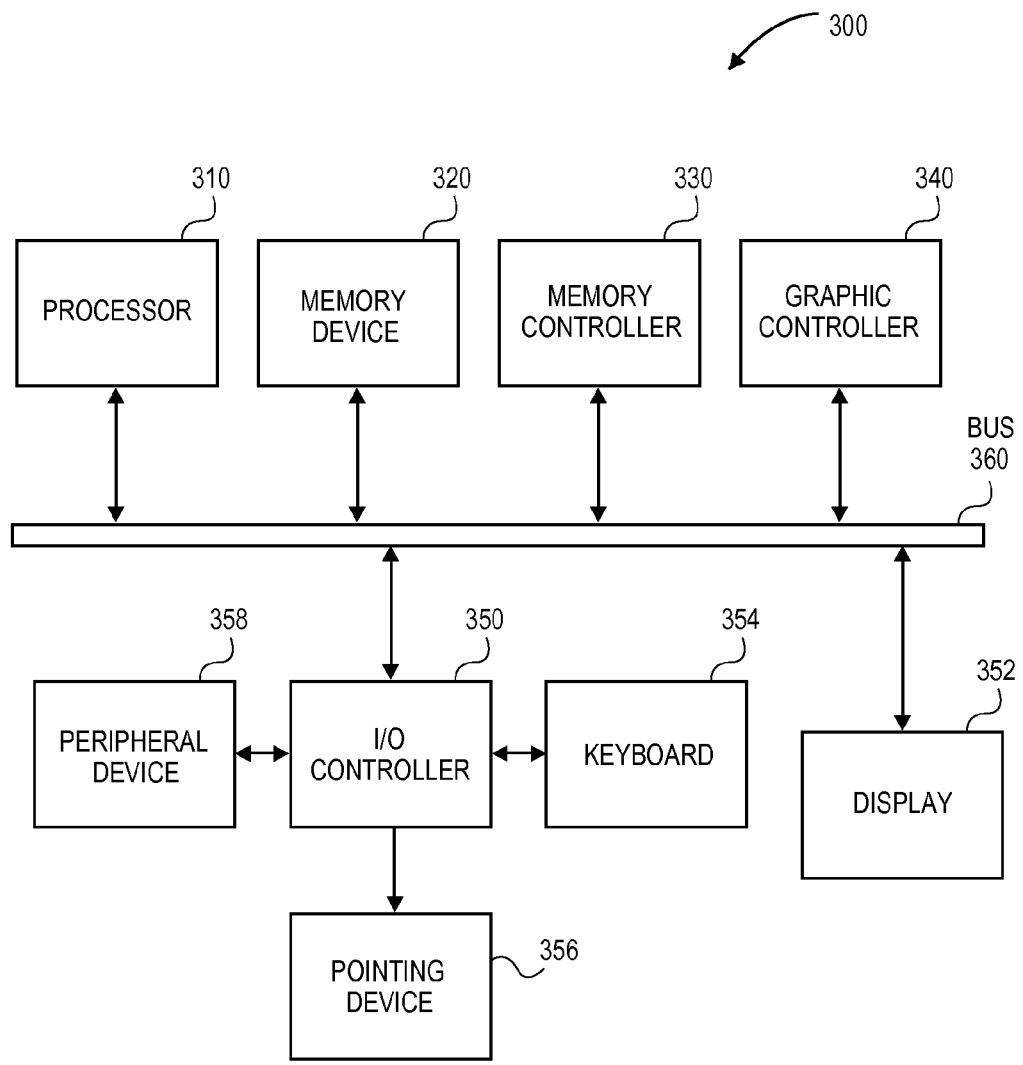
FIG. 24 represents a system in accordance with embodiments of the invention.

FIG. 24 shows a computer system according to an embodiment of the invention. System 300 includes a processor 310, a memory device 320, a memory controller 330, a graphics controller 340, an input and output (I/O) controller 350, a display 352, a keyboard 354, a pointing device 356, and a peripheral device 358, all of which may be communicatively coupled to each other through a bus 360, in some embodiments. Processor 310 may be a general purpose processor or an application specific integrated circuit (ASIC). I/O controller 350 may include a communication module for wired or wireless communication. Memory device 320 may be a dynamic random access memory (DRAM) device, a static random access memory (SRAM) device, a flash memory device, or a combination of these memory devices. Thus, in some embodiments, memory device 320 in system 300 does not have to include a DRAM device.

One or more of the components shown in system 300 may be included in/and or may include one or more integrated circuit packages, such as a chip 160 or 3D package of FIG. 23 for example. For example, processor 310, or memory device 320, or at least a portion of I/O controller 350, or a combination of these components may be included in an integrated circuit package that includes at least one embodiment of a structure described in the various embodiments.

These elements perform their conventional functions well known in the art. In particular, memory device 320 may be used in some cases to provide long-term storage for the executable instructions for a method for forming packaged structures in accordance with embodiments of the present invention, and in other embodiments may be used to store on a shorter term basis the executable instructions of a method for forming package structures in accordance with embodiments of the present invention during execution by processor 310. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 320 may supply the processor 310 with the executable instructions for execution.

System 300 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Figure 25:
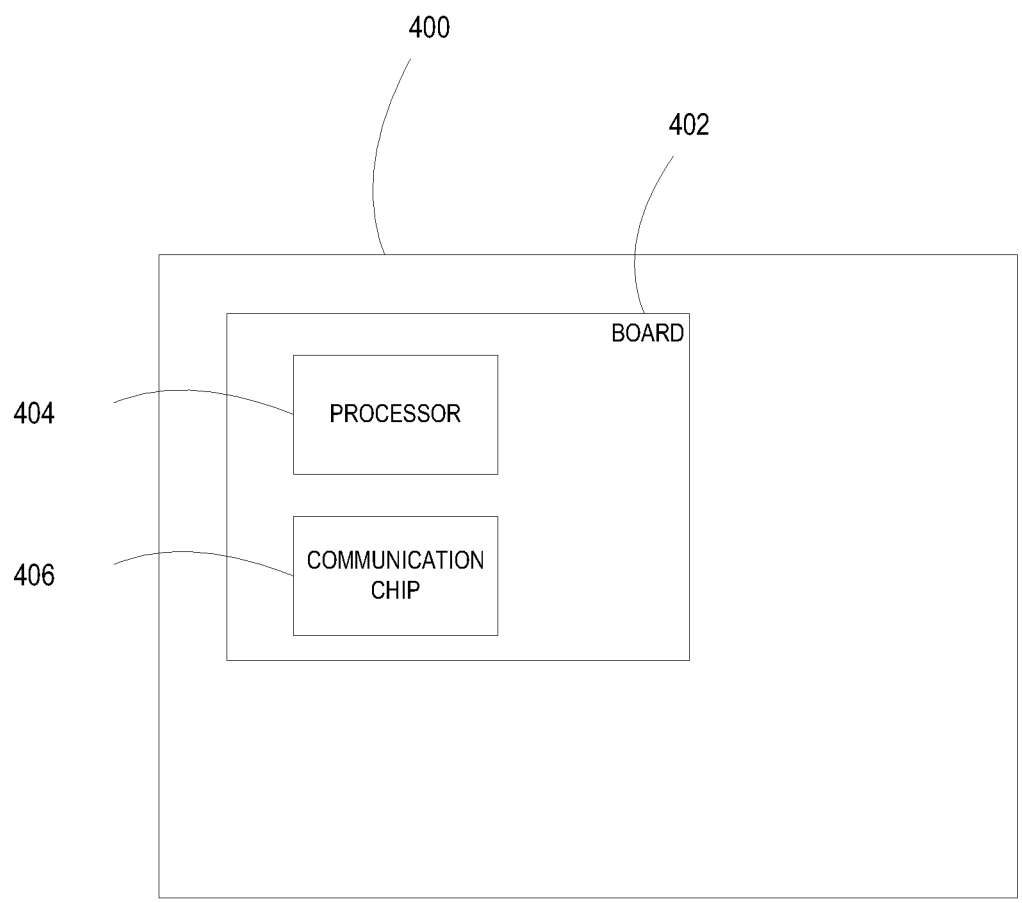
FIG. 25 represents a computing device in accordance with embodiments of the invention.

FIG. 25 illustrates a computing device 400 in accordance with one embodiment of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor may be included in or may include one or more integrated circuit packages, such as chip 160 or 3D package of FIG. 23 for example. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip may be included in or may include one or more integrated circuit packages, such as chip 160 or 3D package of FIG. 23 for example.

In further implementations, another component housed within the computing device 400 may contain an integrated circuit package, such as chip 160 or 3D package of FIG. 23 for example. In addition, the processor 404, communication chip 406 and other components housed within the computing device 400 may be stacked in a 3D package of FIG. 23 for example.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A 3D interconnect structure comprising:
   a semiconductor substrate having a front surface and a back surface;
   a dual damascene via and redistribution layer (RDL); wherein the via extends through the semiconductor substrate between the front and back surfaces, and the RDL is formed over the back surface in a trench opening; and
   an insulating liner layer formed on side surfaces of the dual damascene via and the trench opening, and not formed on bottom surfaces of the dual damascene via and the trench opening.

2. The 3D interconnect structure of claim 1, further comprising a passivation layer disposed between the back surface and the RDL.

3. The 3D interconnect structure of claim 2, wherein the passivation layer comprises silicon carbide or silicon nitride.

4. The 3D interconnect structure of claim 1, wherein the dual damascene via and RDL further comprise a continuous barrier layer formed on the bottom surfaces of the dual damascene via and the trench opening, and on the insulating liner layer formed on the side surfaces of the dual damascene via and the trench opening.

5. The 3D interconnect structure of claim 3, further comprising:
   an array of landing pads arranged over the back surface in a series of rows and columns;
   an array of through-silicon vies (TSVs) arranged under the back surface such that the array of TSVs is not directly underneath the array of landing pads; and
   a plurality of RDLs running between two of the rows of the landing pads connecting one of the two rows to a corresponding number of TSVs in the array of TSVs.

6. The 3D interconnect structure of claim 5, wherein the two rows of the landing pads are separated by a pitch of 10 μm to 500 μm.

7. A 3D package comprising:
   a base substrate;
   a chip stack formed over the base substrate;
   wherein the chip stack includes a chip comprising:
      a semiconductor substrate having a front surface and a back surface;
      a dual damascene via and redistribution layer (RDL); wherein the via extends between the front and back surfaces of the semiconductor substrate, and the RDL is formed over the back surface in a trench opening; and
      an insulating liner layer formed on side surfaces of the dual damascene via and the trench opening, and not formed on bottom surfaces of the dual damascene via and the trench opening.

8. The 3D package of claim 7, wherein the chip is a logic chip.

9. The 3D package of claim 8, further comprising a system comprising a bus communicatively coupled to the 3D package.

10. The 3D package of claim 8, wherein the logic chip further comprises:
    an array of landing pads arranged over the back surface in a series of rows and columns;
    an array of through-silicon vias (TSVs) arranged under the back surface such that the array of TSVs is not directly underneath the array of landing pads; and
    a plurality of RDLs running between two of the rows of the landing pads connecting one of the two rows to a corresponding number of TSVs in the array of TSVs.

11. The 3D package of claim 10, wherein the array of landing pads are coupled with a corresponding array of landing pads of a memory chip.

12. A method of forming a dual damascene 3D interconnect structure comprising:
    forming a passivation layer over a back surface of a device wafer, wherein the passivation layer comprises silicon carbide or silicon nitride;
    forming a dielectric layer over the passivation layer;
    forming a trench opening in the dielectric layer;
    forming a via opening in the device wafer between the back surface and a front surface of the device wafer;
    forming an insulating liner layer on side surfaces of the via opening and the trench opening but not on bottom surfaces of the via opening and the trench opening;
    filling a bulk volume of the via and the trench openinig with a conductive metal to form a via and redistribution layer (RDL) including a landing pad, wherein the via is not directly underneath the landing pad; and
    forming a conductive bump over the landing pad.

13. The method of claim 12, wherein forming the trench opening comprises plasma etching the dielectric layer.

14. The method of claim 13, wherein the plasma etching comprises using a patterned photoresist layer as a mask, and stopping the plasma etching on the passivation layer.

15. The method of claim 12, wherein forming the insulating liner layer comprises first depositing an insulating liner material on side and bottom surfaces of the via opening and the trench opening.

16. The method of claim 15, wherein forming the insulating liner layer further comprises anisotropically etching the insulating liner material from the bottom surfaces of the via opening and the trench opening while retaining a substantial thickness of the insulating liner material on the side surfaces of the via opening and the trench opening.

17. The method of claim 12, wherein filling the bulk volume of the via opening and the trench opening with a conductive metal comprises electroplating copper.

18. The method of claim 12, further comprising;
   forming an array of landing pads over the back surface in a series of rows and columns;
   forming an array of through-silicon vias (TSVs) under the back surface such that the array of TSVs is not directly underneath the array of landing pads; and
   forming a plurality of RDLs running between two of the rows of the landing pads connecting one of the two rows to a corresponding number of TSVs in the array of TSVs.

19. The method of claim 18, wherein the two rows of the landing pads are separated by a pitch of 10 μm to 500 μm.

* * * * *